US010852931B2

(12) United States Patent
Merminod et al.

(10) Patent No.: US 10,852,931 B2
(45) Date of Patent: Dec. 1, 2020

(54) INPUT DEVICE INCLUDING A MECHANICAL RATCHET SYSTEM WITH SMART SHIFT

(71) Applicant: Logitech Europe S.A., Lausanne (CH)

(72) Inventors: Baptiste Merminod, Dommartin (CH); Davin O'Mahony, Dublin (IE); Fergal Corcoran, County Cork (IE); Padraig Mcloughlin, County Monogham (IE); Antoine Merminod, Gimel (CH)

(73) Assignee: Logitech Europe S.A., Lausanne (CH)

( * ) Notice: Subject to any disclaimer, the term of this patent is extended or adjusted under 35 U.S.C. 154(b) by 0 days.

(21) Appl. No.: 16/590,192

(22) Filed: Oct. 1, 2019

(65) Prior Publication Data
US 2020/0034028 A1 Jan. 30, 2020

Related U.S. Application Data

(62) Division of application No. 15/456,221, filed on Mar. 10, 2017, now Pat. No. 10,459,618.
(Continued)

(51) Int. Cl.
*G06F 3/0484* (2013.01)
*G06F 3/0362* (2013.01)
(Continued)

(52) U.S. Cl.
CPC ........... *G06F 3/04847* (2013.01); *G05G 1/10* (2013.01); *G05G 5/03* (2013.01); *G05G 5/06* (2013.01); *G06F 3/02* (2013.01); *G06F 3/021* (2013.01); *G06F 3/0213* (2013.01); *G06F 3/038* (2013.01); *G06F 3/0362* (2013.01); *G06F 3/0383* (2013.01); *H03K 17/96* (2013.01); *G05G 1/02* (2013.01); *G05G 1/08* (2013.01); *G06F 3/041* (2013.01); *G06F 2203/04104* (2013.01); *H01H 19/14* (2013.01); *H01H 2003/008* (2013.01);
(Continued)

(58) Field of Classification Search
CPC ............... G09G 3/3258; G09G 3/3233; G09G 2300/043; G09G 3/3266; G09G 2330/04; G09G 2300/0828; H05B 45/37; H05B 47/185; H05B 45/00; H05B 47/175; H02H 3/20; H02H 1/0007
See application file for complete search history.

(56) References Cited

U.S. PATENT DOCUMENTS 3,995,853 A * 12/1976 Deluty ................. A63B 21/015
    482/116
2016/0180820 A1* 6/2016 Pascucci ................. G09G 5/34
    345/684

* cited by examiner

*Primary Examiner* — Robert J Michaud
(74) *Attorney, Agent, or Firm* — Kilpatrick Townsend & Stockton LLP

(57) ABSTRACT

A knob for an input device includes a knob housing being rotatable on an axis, a shaft extending from the knob housing along the axis, a ratchet wheel axially coupled to the shaft with a toothed perimeter, and a ratchet arm to couple to the toothed perimeter of the ratchet wheel when the ratchet arm is engaged such that a ratcheted rotation occurs when the knob is rotated, and decouple from the toothed perimeter of the ratchet wheel when the ratchet arm is disengaged. The knob can further include a resistance wheel axially coupled to the shaft with a substantially smooth perimeter, and a resistance arm to couple to the smooth perimeter of the resistance wheel when the resistance arm is engaged such that a friction is provided when the knob is rotated, and decouple from the smooth perimeter of the resistance wheel when the resistance arm is disengaged.

11 Claims, 17 Drawing Sheets

Related U.S. Application Data

(60) Provisional application No. 62/433,187, filed on Dec. 12, 2016.

(51) Int. Cl.
*G06F 3/02* (2006.01)
*G06F 3/038* (2013.01)
*G05G 5/06* (2006.01)
*G05G 1/10* (2006.01)
*G05G 5/03* (2008.04)
*H03K 17/96* (2006.01)
*G05G 1/02* (2006.01)
*H01H 3/00* (2006.01)
*G05G 1/08* (2006.01)
*G06F 3/041* (2006.01)
*H01H 19/14* (2006.01)

(52) U.S. Cl.
CPC ... *H01H 2235/01* (2013.01); *H01H 2300/038* (2013.01)

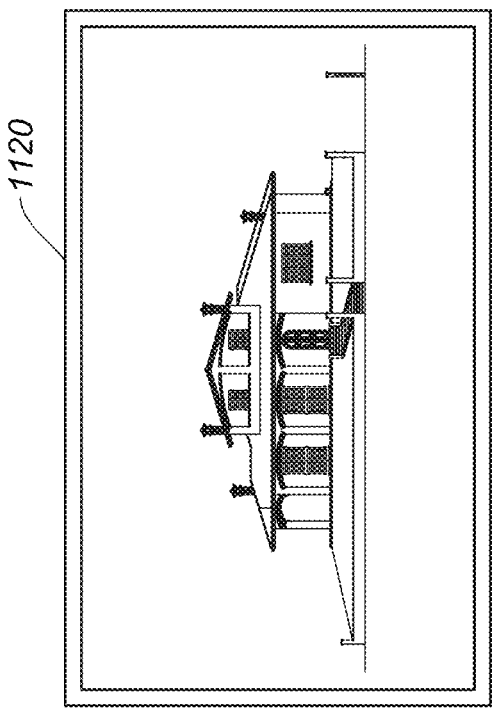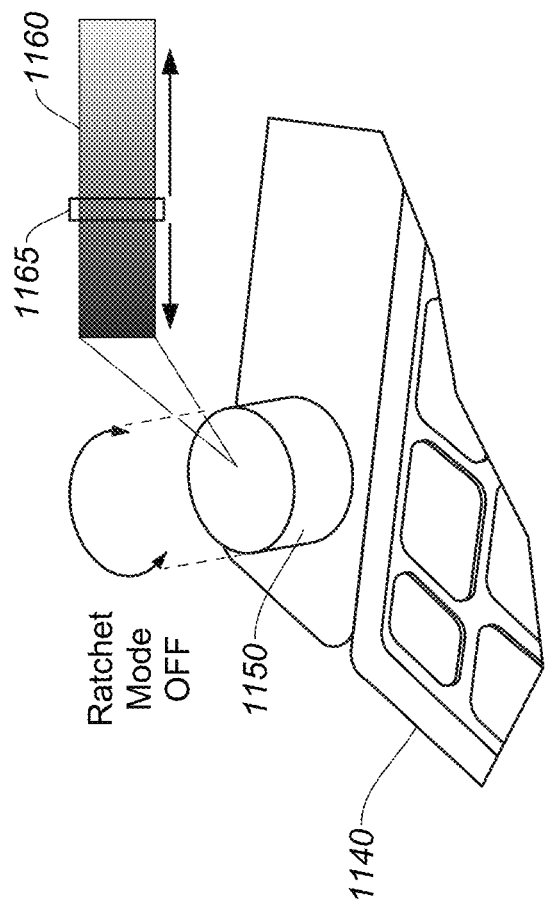
FIG. 10
FIG. 11

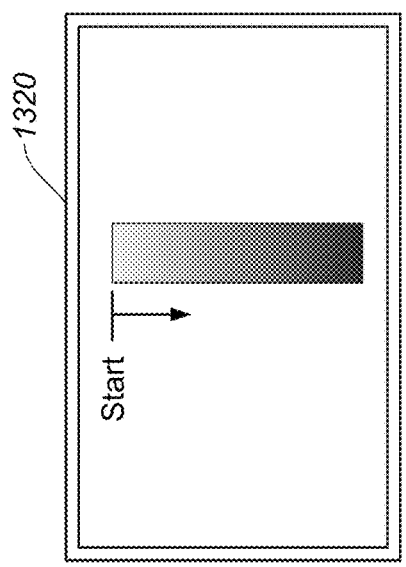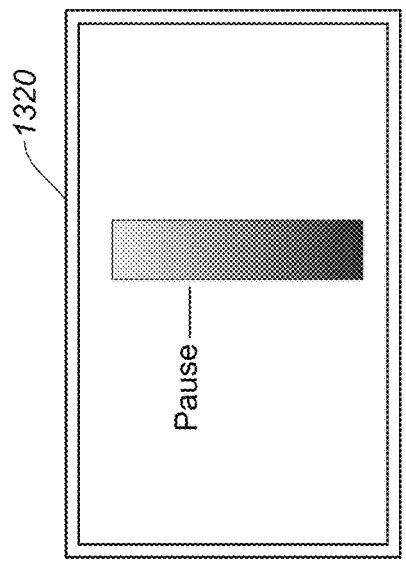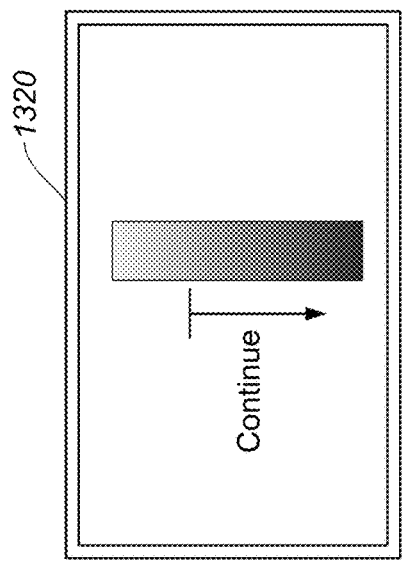
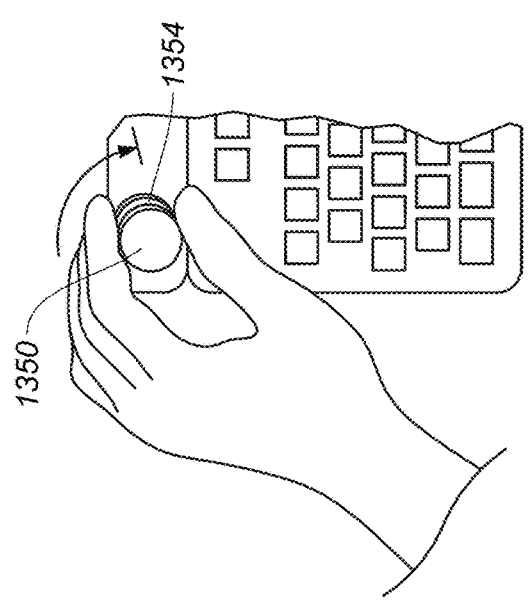
FIG. 13A
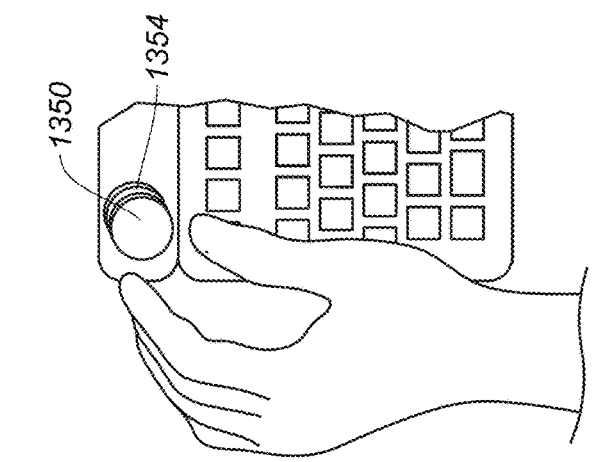
FIG. 13B
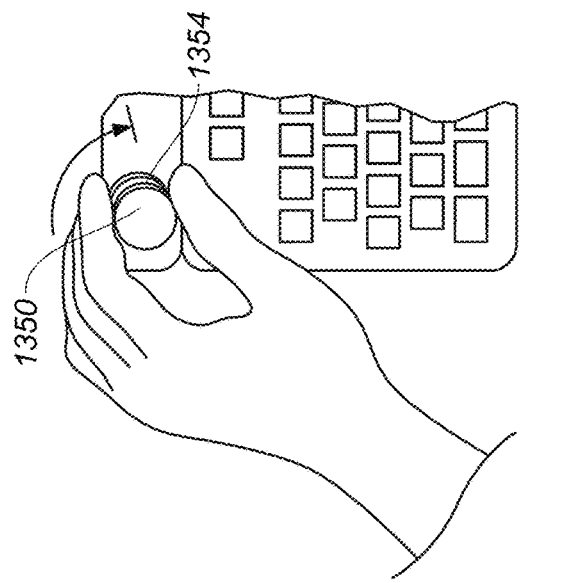
FIG. 13C

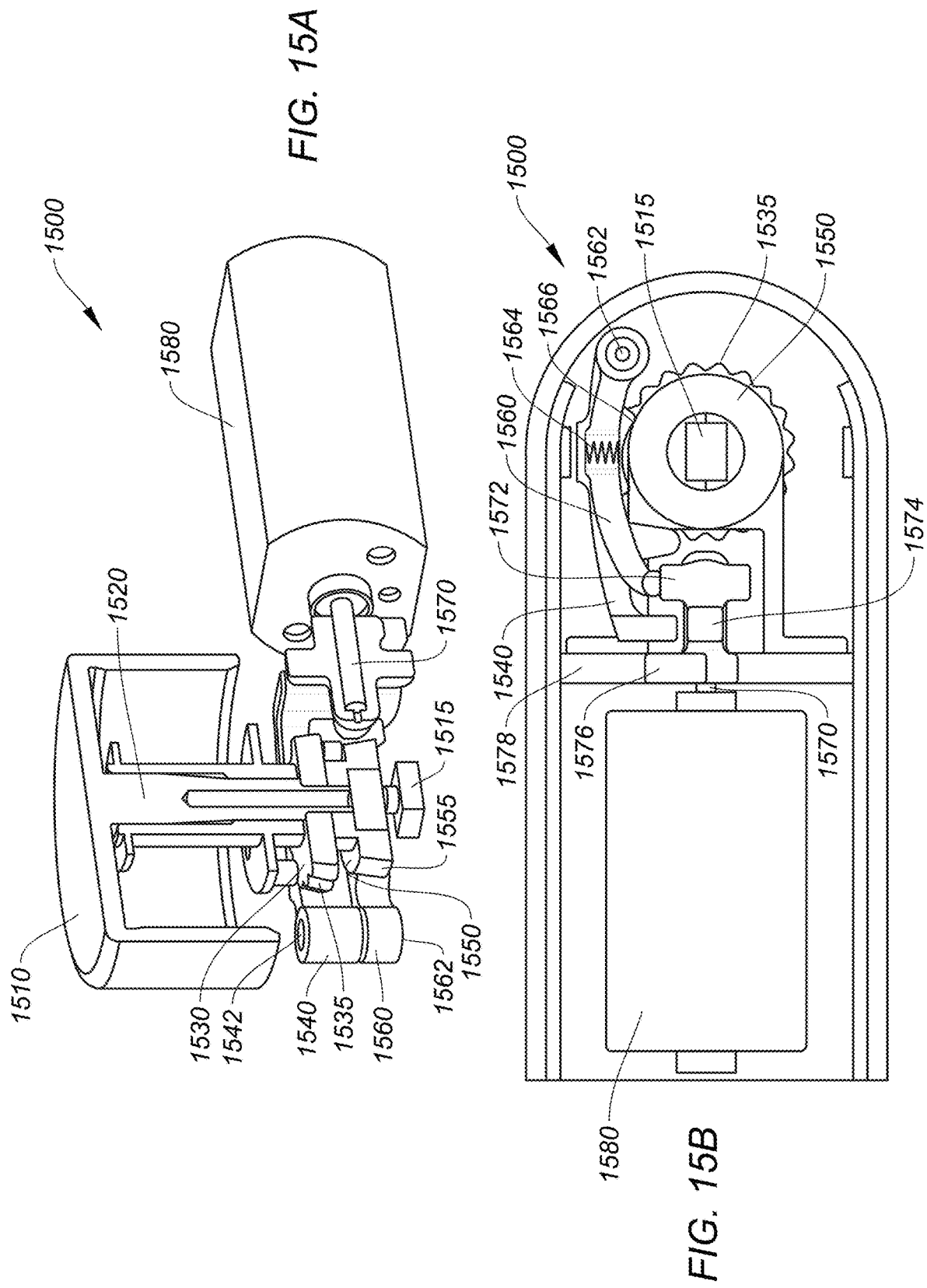

INPUT DEVICE INCLUDING A MECHANICAL RATCHET SYSTEM WITH SMART SHIFT

CROSS-REFERENCES TO RELATED APPLICATIONS

This application is divisional of U.S. Non-Provisional application Ser. No. 15/456,221, filed on Mar. 10, 2017, and titled "INPUT DEVICE INCLUDING A MECHANICAL RATCHET SYSTEM WITH SMART SHIFT," which claims the benefit and priority of U.S. Provisional Application No. 62/433,187, filed on Dec. 12, 2016, and titled "CONTEXTUALLY-BASED FUNCTIONAL ASSIGNMENT FOR A USER-MANIPULABLE ELEMENT ON AN INPUT DEVICE," which is hereby incorporated by reference in its entirety for all purposes.

BACKGROUND

Peripheral devices generally include any auxiliary device that can be used to interface human and computer. Some common peripheral devices include keyboards, computer mice, image scanners, speakers, microphones, web cameras, and more.

Keyboards and computer mice, in particular, have improved in function and performance over the last few decades to increase user productivity. For instance, the advent of function keys, key pads, programmable hot keys, scroll wheels, and the like, have helped users become more efficient by placing commonly used functions in quickly accessible locations. However, despite these improvements, more powerful, feature-laden software (e.g., Photoshop®) still requires users to navigate cumbersome and sometimes non-intuitive interfaces with nested menus and windows that still can make for highly inefficient work-sessions, especially for software users that are not highly experienced or steeped in the particular software. New developments are needed to improve the user interface, streamline workflow, and increase work efficiencies across a broad spectrum of applications.

BRIEF SUMMARY

In certain embodiments, a knob for an input device includes a knob housing being rotatable on an axis, a shaft extending from the knob housing along the axis, a ratchet wheel axially coupled to the shaft, where the ratchet wheel can be rotatable on the axis and may include a toothed perimeter, and a ratchet arm to couple to the toothed perimeter of the ratchet wheel when the ratchet arm is engaged such that a ratcheted rotation occurs when the knob is rotated and decouple from the toothed perimeter of the ratchet wheel when the ratchet arm is disengaged. The knob can further include a resistance wheel axially coupled to the shaft, where the resistance wheel can be rotatable on the axis and may include a substantially smooth perimeter, and a resistance arm to couple to the smooth perimeter of the resistance wheel when the resistance arm is engaged such that a friction is provided when the knob is rotated and decouple from the smooth perimeter of the resistance wheel when the resistance arm is disengaged.

In some embodiments, the knob can further include a switch disposed below and substantially in axial alignment with the shaft, where the knob is depressible and the switch can be activated when the knob is depressed. The knob may include a second ratchet arm to couple to the toothed perimeter of the ratchet wheel when the second ratchet arm is engaged such that a ratcheted rotation occurs when the knob housing is rotated and decouple with the toothed perimeter of the ratchet wheel when the second ratchet arm is disengaged. In some cases, the knob further includes a second resistance arm to couple to the smooth perimeter of the resistance wheel when the second resistance arm is engaged such that a friction is provided when the knob housing is rotated and decouple with the smooth perimeter of the resistance wheel when the second resistance arm is disengaged, where the ratchet arm and second ratchet arm can be symmetrically disposed on opposite sides of the ratchet wheel, and the resistance arm and second resistance arm may be symmetrically disposed on opposite sides of the resistance wheel.

In some embodiments, the knob may further include a second shaft having a first cam and a second cam protruding therefrom where when the second shaft is rotated into a first position, the first cam can contact a portion of the ratchet arm causing the ratchet arm to engage the ratchet wheel, and when the second shaft is rotated into a second position, the second cam can contact a portion of the resistance arm causing the resistance arm to engage the resistance wheel. In some cases, the first cam and the second cam are configured on the second shaft such that when the first cam contacts the ratchet arm, the second cam does not contact the resistance arm, and when the second cam contacts the resistance arm, the second cam does not contact the ratchet arm. In alternative embodiments, the knob can include a second shaft including a first cam and a second cam protruding therefrom, where when the second shaft is rotated into a first position, the first cam can contact a portion of the ratchet arm causing the ratchet arm to disengage the ratchet wheel, and when the second shaft is rotated into a second position, the second cam can contact a portion of the resistance arm causing the resistance arm to disengage the resistance wheel.

In some implementations, the knob can further include a first compression spring coupled to the ratchet arm to provide a force causing the ratchet arm to be normally engaged with the ratchet wheel, and a second compression spring coupled to the resistance arm to provide a force causing the resistance arm to be normally engaged with the resistance wheel.

In further embodiments, the knob can include a processor and an electric motor controlled by the processor, the electric motor coupled to the second shaft, where the second shaft is rotatable by the electric motor to at least the first position and the second position. The knob can include a user-accessible rotatable element coupled to the second shaft to allow a user to rotate the second shaft to at least the first position and the second position. Some embodiments may have a braking system to cause the second shaft to stop rotating at either the first position or the second position. The braking system can include a third cam on the second shaft, a first obstruction to stop the third cam from rotating when the second shaft rotates to the first position, and a second obstruction to stop the third cam from rotating when the second shaft rotates to the second position, where the first and second obstruction define a range of rotation for the second shaft. In some cases, the second shaft can further include a third cam protruding therefrom to contact the ratchet arm when the ratchet arm is engaged, where the contact between the third cam and the ratchet arm can be adjustable to cause an intensity of the ratcheted rotation to increase or decrease.

In certain embodiments, a ratchet arm contacting surface of the third cam can be contoured to provide one of a range of forces to the ratchet arm based on which of a portion of the ratchet arm contacting surface is contacting the ratchet arm, where each of the range of forces to the ratchet arm corresponds to a different intensity of ratcheted rotation. In further embodiments, the second shaft can further include a fourth cam protruding therefrom to contact the resistance arm when the resistance arm is engaged, where the contact between the fourth cam and the resistance wheel is adjustable to cause an intensity of the friction to increase or decrease. Similarly, a resistance arm contacting surface of the fourth cam can be contoured to provide one of a range of forces to the resistance arm based on which of a portion of the resistance arm contacting surface is contacting the resistance arm, where each of the range of forces to the resistance arm corresponds to a different intensity of friction. The toothed perimeter of the ratchet wheel can include a low friction material, and the substantially smooth perimeter of the resistance wheel can include a high friction material.

In certain embodiments, a computer-implemented method for the operation of a knob on an input device includes receiving input data, by a processor, corresponding to a selection of one of a ratchet-mode of operation for the knob and a resistance-mode of operation for the knob. When the input data corresponds to the ratchet-mode of operation, the method can include controlling a ratchet arm to engage with a toothed perimeter of a ratchet wheel that is axially coupled to the knob to provide a ratcheted rotation when the knob is rotated. When the input data corresponds to the resistance-mode of operation, the method can include controlling a resistance arm to engage with a substantially smooth perimeter of a resistance wheel that is axially coupled to the knob to provide a frictional resistance to rotation when the knob is rotated. In some cases, the ratchet arm includes a first set of compression springs to cause the ratchet arm to be normally engaged with the ratchet wheel, and the resistance arm includes a second set of compression springs to cause the resistance arm to be normally engaged with the resistance wheel.

In some embodiments, when the input data corresponds to the ratchet-mode of operation, the method can further include controlling the resistance arm to disengage from the resistance wheel. In some cases, when the input data corresponds to the resistance-mode of operation, the method can include controlling the ratchet arm to disengage from the ratchet wheel. The input data can further include intensity data, where when the input data corresponds to the ratchet-mode of operation, the method can include modifying an intensity of the ratcheted rotation based on the intensity data, and when the input corresponds to the resistance-mode of operation, the method can include modifying an intensity of the frictional resistance to rotation based on the intensity data. In certain embodiments, modifying the intensity of the ratcheted rotation includes controlling the rotation of a cam shaft such that a first cam on the cam shaft provides a disengaging force to the ratchet arm by an amount corresponding to the intensity data, and modifying the intensity of the frictional resistance to rotation includes controlling the rotation of the cam shaft such that a second cam on the cam shaft provides a disengaging force to the resistance arm by an amount corresponding to the intensity data.

BRIEF DESCRIPTION OF THE DRAWINGS

The detailed description is set forth with reference to the accompanying figures.

FIG. 10 shows aspects of associating a function with a user-manipulable object on an input device, according to certain embodiments.

FIG. 11 shows aspects of associating a function with a user-manipulable object on an input device, according to certain embodiments.

FIG. 13A-C shows aspects of associating a function with a user-manipulable object on an input device, according to certain embodiments.

FIG. 15A shows a simplified overall cutaway view of a smart-shift mechanical ratchet system for a knob, according to certain embodiments.

FIG. 15B shows a cutaway plan view of aspects of smart-shift mechanical ratchet system, according to certain embodiments.

DETAILED DESCRIPTION

Figure 1:
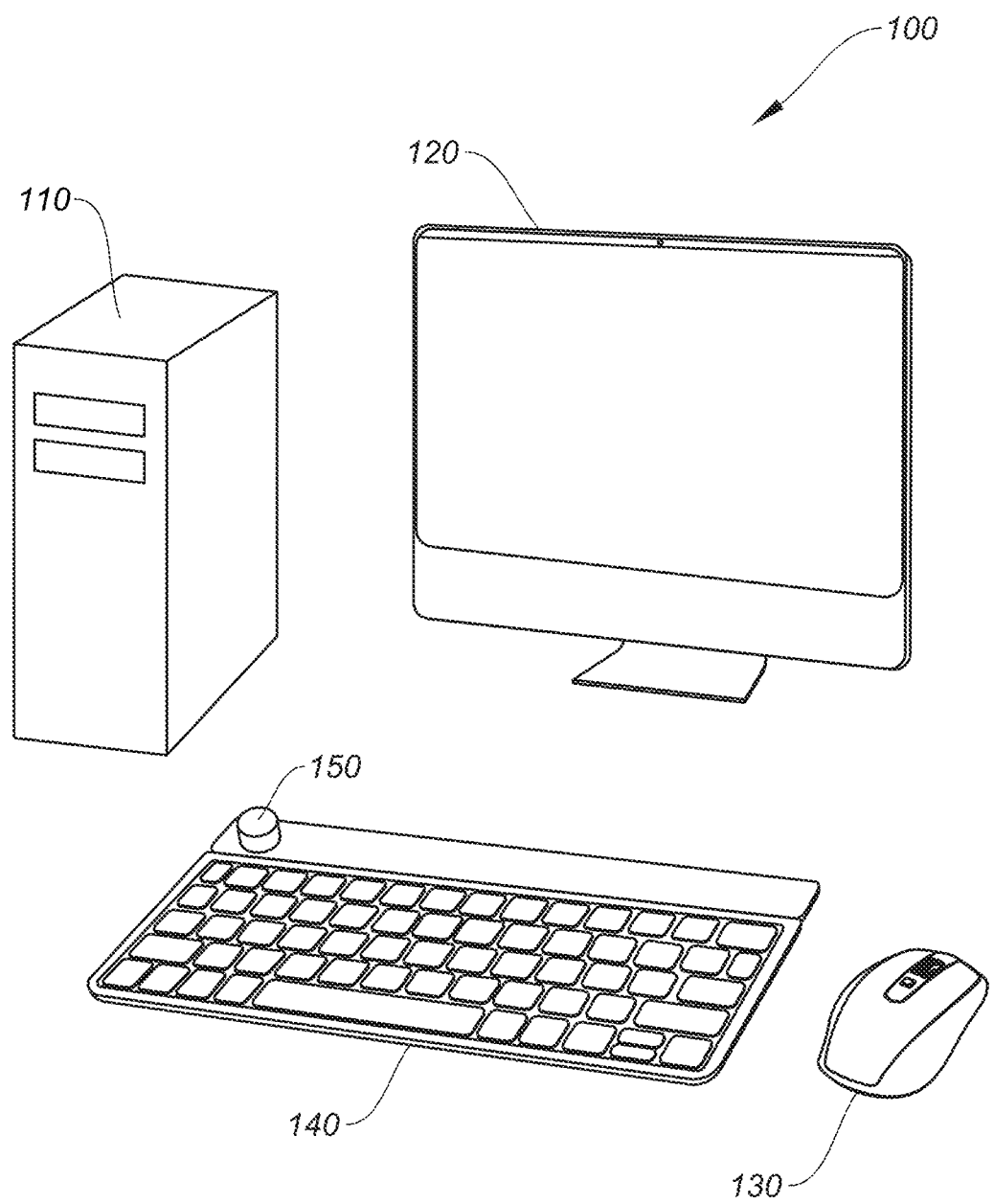
FIG. 1 shows a typical implementation for a system utilizing a contextually-based functional assignment for a user-manipulable element on an input device, according to certain embodiments.

Aspects of the present disclosure relate generally to input devices, and in particular to a smart-shift mechanical ratchet system, according to certain embodiments.

In the following description, various embodiments of a smart-shift mechanical ratchet system will be described. For purposes of explanation, specific configurations and details are set forth in order to provide a thorough understanding of the embodiments. However, it will be apparent to one skilled in the art that certain embodiments may be practiced or implemented without every detail disclosed. Furthermore, well-known features may be omitted or simplified in order to prevent any obfuscation of the novel features described herein.

Conceptual Overview of Certain Embodiments

Some embodiments of the invention relate to a user-manipulable element (e.g., a knob) disposed on an input device (e.g., keyboard) that can be assigned a function based on a contextual interaction on a graphical user interface (GUI). More specifically, the input device may include a user-manipulable knob (see, e.g., element 150 of FIG. 1), a ratchet system disposed in the knob to apply a ratcheted or non-ratcheted mode, and one or more touch-sensitive sensors ("touch sensor(s)") disposed on a surface of the knob. An operational configuration can be applied to the knob which may control one or more aspects of knob rotation, knob rotation resolution, knob rotation resistance (e.g., torque friction), knob ratchet/no-ratchet modes, touch-based functions, and the like, as further discussed below. The operational configuration can be based on a contextual usage of the input device. For example, selecting alphanumeric text on a display may cause the knob to control functions associated with alphanumeric text, such as font size, font type, font color, font position, and the like, as further discussed below.

The input device can be connected to and/or controlled by a host computing device. For instance, one or more processors of the host computing device can detect a selectable control element on a GUI (e.g., alphanumeric text), determine an editable parameter (e.g., font size) associated with the selectable control element, and associate a control of the editable parameter with a user-manipulable element on an input device. The one or more processors can further generate and send control data causing the input device (e.g., a processor of the input device) to assign a performance characteristic to the knob based on properties of the editable parameter. As discussed above, the performance characteristic may include a rotation resistance of the knob, a rotational input resolution of the knob (e.g., rotation sensitivity), a setting of a ratchet or non-ratchet mode of operation to the knob based on the properties of the editable parameter, a function of one or more touch sensors on the knob, or a depressible function (e.g., button press). In some aspects, the control data can control an electro-magnetic actuator (e.g., clutch) in the control knob to set the ratchet mode and non-ratchet mode of operation. In certain embodiments, touching the touch sensor(s) (e.g., input data) may cause the touch sensor to enter a value that is selected by rotating the knob, similar to how an "enter" key on a keyboard may enter data typed into a data field. In some cases, touching the touch sensor(s) may cause the knob to switch a control of a first editable parameter associated with the selectable control element to a second selectable control element in response to receiving the input data.

In some embodiments, a smart-shift mechanical ratchet system for a knob is described. The knob can include a knob housing that is rotatable on an axis with a shaft extending from the knob along the axis. A ratchet wheel having a toothed perimeter can be axially coupled to the shaft where the ratchet wheel is rotatable on the axis in correspondence with a rotation of the knob housing. A ratchet arm may be coupled to the toothed perimeter of the ratchet wheel when the ratchet arm is engaged such that a ratcheted rotation occurs when the knob is rotated. The ratchet arm can decouple from the toothed perimeter of the ratchet wheel when the ratchet arm is disengaged. Some embodiments may further include a resistance wheel with a substantially smooth perimeter axially coupled to the shaft where the resistance wheel is rotatable on the axis in correspondence with a rotation of the knob housing. The resistance wheel can be smooth with little to no imperfections in the surface, slightly rough, knurled, dimpled, textured, etc. In some cases, resistance wheel can be bumpy or may include different textures disposed thereon. Typical embodiments will be generally smooth but may vary accordingly, as would be understood by one of ordinary skill in the art. A resistance arm may be coupled to the smooth perimeter of the resistance wheel when the resistance arm is engaged such that a friction is provided when the knob is turned. The resistance arm may decouple from the resistance wheel when the resistance arm is disengaged. The knob can be depressible to activate a switch in axial alignment with the shaft for a push button operation. Some embodiments may have single or double ratchet and/or resistance arm configurations. A motor driven cam shaft (second shaft) can be used to engage and disengage the ratchet and resistance arms with their corresponding wheels. In some cases, compression springs may cause both the ratchet arm and resistance arms to be normally engaged with their corresponding wheels. Various embodiments of the smart-shift mechanical ratchet system are further discussed below with respect to FIGS. 14-21.

Typical System Environment for Certain Embodiments

FIG. 1 shows a typical implementation for a system 100 utilizing a contextually-based functional assignment for a user-manipulable element 150 on an input device 140, according to certain embodiments. System 100 may include computer 110, display 120, input device 130 (e.g., "computer mouse 130"), and input device 140 (e.g., "keyboard 140"). Keyboard 140 can include a user-manipulable element 150 ("knob 150"). For system 100, input device 130 and keyboard 140 can be configured to control aspects of computer 110 and display 120, as would be understood by one of ordinary skill in the art. Computer 110 can be referred to as a "host computer" or a "host computing device."

Computer 110 may include a machine readable medium (not shown) that is configured to store computer code, such as keyboard driver software, and the like, where the computer code is executable by a processor (e.g., processor(s) 302) of computer 110 to affect control of computer 110 by input devices 130 and/or 140. The various embodiments described herein generally refer to input device 140 as a keyboard or similar input device, however it should be understood that input device 140 can be any input/output (I/O) device, user interface device, control device, input unit, or the like.

The user-manipulable element is typically described as a knob throughout this disclosure, however it should be understood that any suitable user-manipulable element can be used, such as a button, scroll wheel, trackball, joystick, slider, or the like, as would be understood by one of ordinary skill in the art. A "knob," as described herein, can be interchangeably referred to as a "dial" or "crown."

Input device 140 is typically described as a keyboard throughout this disclosure, however it should be understand that any suitable input device that can include a user-manipulable object, as described herein, can be used including, but not limited to, a computer mouse, a remote control device, a wearable device (e.g., smart watch, wristband, glasses), a smart phone, or the like.

The host computing device is typically described as a desktop or laptop computing device. However, it should be understood that the host computing device can be any suitable computing device further including a tablet computer, a smart phone, a virtual or augmented reality interface (e.g., having 2D or 3D displays), a holographic interface, or the like. One of ordinary skill in the art would understand the many variations, modifications, and alternative embodiments thereof.

Figure 2:
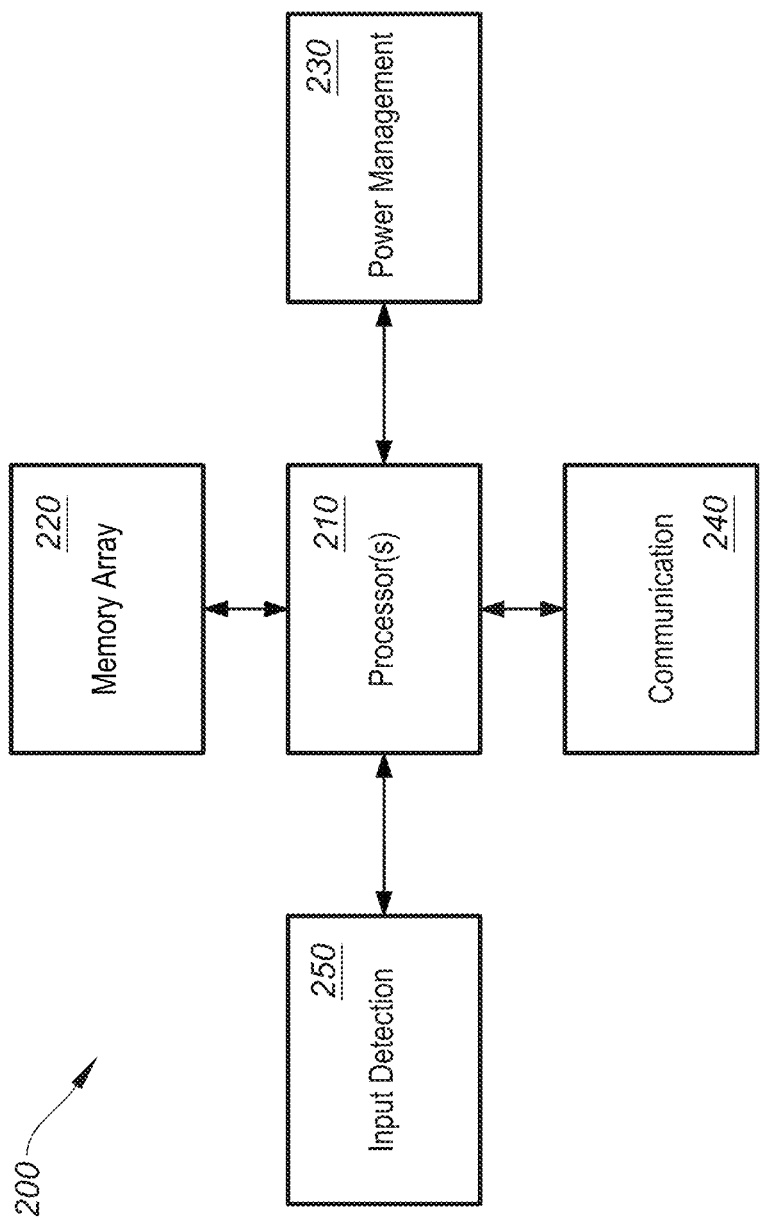
FIG. 2 shows a system for operating an input device, according to certain embodiments.

FIG. 2 shows a system for operating an input device 140, according to certain embodiments. System 200 includes processor(s) 210, memory array 220, power management system 230, communication system 240, and input detection module 250. Each of the system blocks 220-250 can be in electrical communication with the processor(s) 210 (e.g., via a bus system). System 200 may further include additional systems that are not shown or discussed to prevent obfuscation of the novel features described herein. System blocks 220-250 may be implemented as separate modules, or alternatively, more than one system block may be implemented in a single module. In the context described herein, input device 140 can be a keyboard with knob 150, as described above with respect to FIG. 1.

In certain embodiments, processor(s) 210 comprises one or more microprocessors (μCs) and can be configured to control the operation of system 200. Alternatively, processor(s) 210 may include one or more microcontrollers (MCUs), digital signal processors (DSPs), or the like, with supporting hardware and/or firmware (e.g., memory, programmable I/Os, etc.), as would be appreciated by one of ordinary skill in the art. Processor(s) 210 can control some or all aspects of operation of input device 140 (e.g., system block 220-250). Alternatively or additionally, some of system blocks 220-250 may include an additional dedicated processor, which may work in conjunction with processor 210. One of ordinary skill in the art would understand the many variations, modifications, and alternative embodiments thereof.

Memory array 220 may be configured to store information pertaining to one or more operational configurations of input device 140. As further discussed below, one or more operational configurations of input device 140 may include setting performance characteristics of knob 150, including but not limited to, a rotation resistance of the knob, a rotational input resolution of the knob (e.g., rotation sensitivity), setting a ratchet or non-ratchet mode of operation to the knob based on the properties of the editable parameter, a function of a depressible knob, a sensitivity of one or more touch sensors on knob 150, functions associated with multiple detected touches on knob 150 (by the touch sensors), their corresponding locations, and the like, as further discussed below.

Memory array 220 can further include stored input values associated with corresponding keys of keyboard 150, as would be understood by one of ordinary skill in the art. Additionally, memory array 220 can store one or more software programs to be executed by processors (e.g., in processor(s) 210). It should be understood that "software" can refer to sequences of instructions that, when executed by processing unit(s) (e.g., processors, processing devices, etc.), cause system 200 to perform certain operations of software programs. The instructions can be stored as firmware residing in read-only memory (ROM) and/or applications stored in media storage that can be read into memory for processing by processing devices. Software can be implemented as a single program or a collection of separate programs and can be stored in non-volatile storage and copied in whole or in-part to volatile working memory during program execution.

Power management system 230 can be configured to manage power distribution, recharging, power efficiency, and the like, for input device 140. In some embodiments, power management system 230 can include a battery (not shown), a USB based recharging system for the battery (not shown), and power management devices (e.g., low-dropout voltage regulators—not shown). In certain embodiments, the functions provided by power management system 230 may be incorporated into processor(s) 210. The power source can be a replaceable battery, a rechargeable energy storage device (e.g., super capacitor, Lithium Polymer Battery, NiMH, NiCd), or a corded power supply. The recharging system can be an additional cable (specific for the recharging purpose) or it can use a USB connection to recharge the battery.

Communications system 240 can be configured to provide wireless communication with computer 110, or other devices and/or peripherals, according to certain embodiments. Communications system 240 can be configured to provide radio-frequency (RF), Bluetooth®, infra-red (IR), ZigBee®, or other suitable communication technology to communicate with other computing devices and/or peripheral devices. System 200 may optionally comprise a hard-wired connection to computer 110. For example, keyboard 140 can be configured to receive a Universal Serial Bus (USB) cable to enable bi-directional electronic communication with computer 110 or other external devices. Some embodiments may utilize different types of cables or connection protocol standards to establish hardwired communication with other entities.

Input detection module 250 can control the detection of a user-interaction with input elements on input device 140. For instance, input detection module 250 can detect user inputs on knob 150, key presses on the various keys of input device 140 (e.g., QWERTY keys, function keys, number pad keys, etc.), or other suitable input elements or device such as a media control button, voice-over-internet-protocol (VoIP) button, touch sensors (e.g., touch pads) and the like. In some embodiments, input detection module 250 can work in conjunction with memory array 220 to detect inputs on input device 140 and associate various functions with each input element (e.g., knob 150).

Although certain systems may not expressly discussed, they should be considered as part of system 200, as would be understood by one of ordinary skill in the art. For example, system 200 may include a bus system to transfer power and/or data to and from the different systems therein.

It should be appreciated that system 200 is illustrative and that variations and modifications are possible. System 200 can have other capabilities not specifically described herein. Further, while system 200 is described with reference to particular blocks, it is to be understood that these blocks are defined for convenience of description and are not intended to imply a particular physical arrangement of component parts. Further, the blocks need not correspond to physically distinct components. Blocks can be configured to perform various operations, e.g., by programming a processor or providing appropriate control circuitry, and various blocks might or might not be reconfigurable depending on how the initial configuration is obtained.

Embodiments of the present invention can be realized in a variety of apparatuses including electronic devices implemented using any combination of circuitry and software. Furthermore, aspects and/or portions of system 200 may be combined with or operated by other sub-systems as required by design. For example, input detection module 250 and/or memory 220 may operate within processor(s) 210 instead of functioning as a separate entity. In addition, the inventive concepts described herein can also be applied to a mouse, keypad, or other similar input device. For instance, aspects of system 200 can be applied to a computer mouse, including knob 150. Further, system 200 can be applied to any of the input devices described in the embodiments herein, whether explicitly, referentially, or tacitly described (e.g., would have been known to be applicable to a particular input device by one of ordinary skill in the art). The foregoing embodiments are not intended to be limiting and those of ordinary skill in the art with the benefit of this disclosure would appreciate the myriad applications and possibilities.

Figure 3:
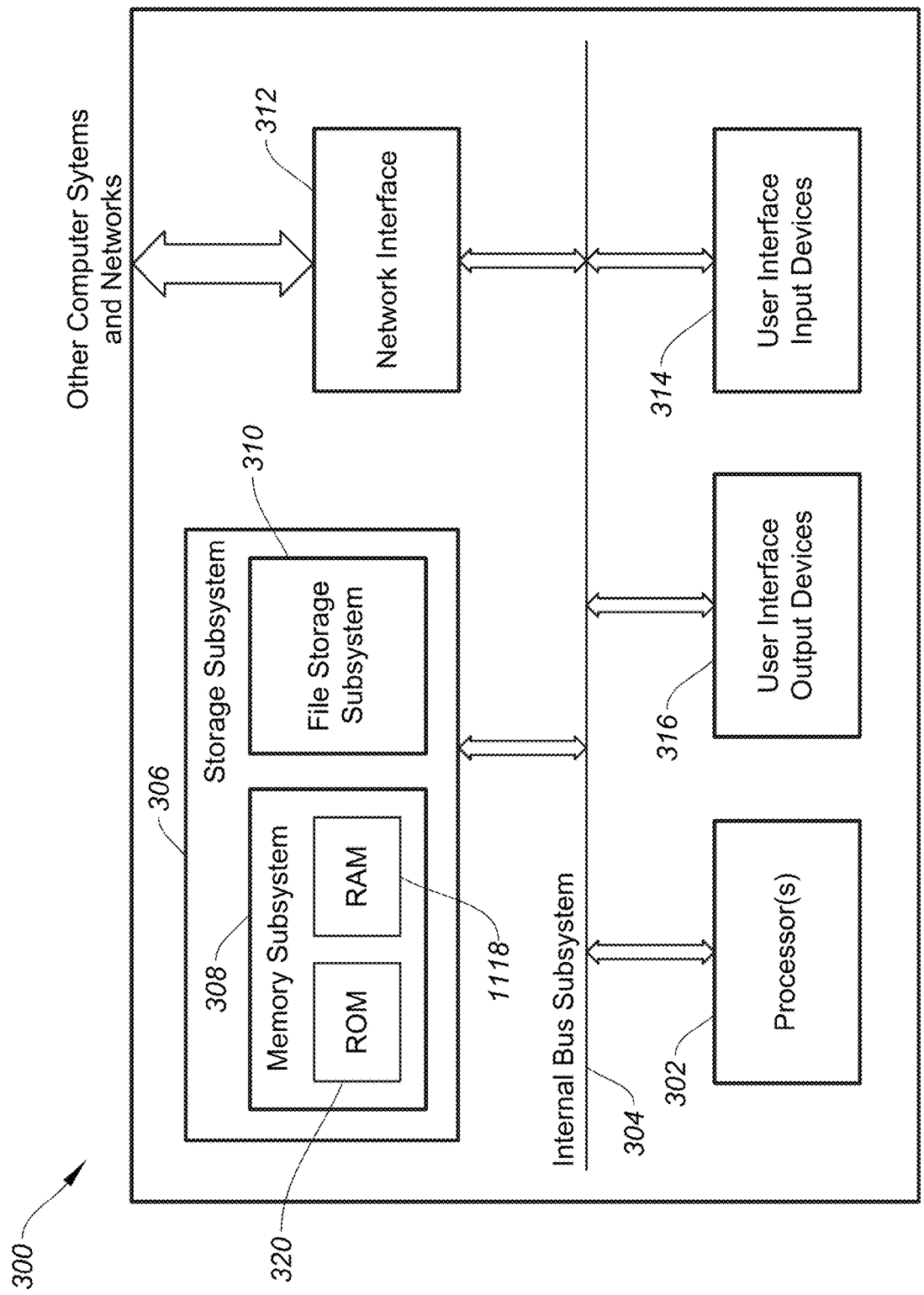
FIG. 3 shows a system for operating a host computing device, according to certain embodiments.

FIG. 3 shows a system 300 for operating a host computing device (e.g., host computing device 110), according to certain embodiments. System 300 can be used to implement any of the host computing devices discussed herein with respect to FIGS. 1 and 4-13 and the myriad embodiments defined herein or within the purview of this disclosure but not necessarily explicitly described. System 300 can include one or more processors 302 that can communicate with a number of peripheral devices (e.g., input devices) via a bus subsystem 304. These peripheral devices can include storage subsystem 306 (comprising memory subsystem 308 and file storage subsystem 310), user interface input devices 314, user interface output devices 316, and network interface subsystem 312. User input devices 314 can be any of the input device types described herein (e.g., keyboard, computer mouse, remote control, etc.). User output devices 316 can be a display of any type, including computer monitors, displays on handheld devices (e.g., smart phones, gaming systems), or the like, as would be understood by one of ordinary skill in the art. Alternatively or additionally, a display may include virtual reality (VR) displays, augmented reality displays, holographic displays, and the like, as would be understood by one of ordinary skill in the art.

In some examples, internal bus subsystem 304 can provide a mechanism for letting the various components and subsystems of computer system 300 communicate with each other as intended. Although internal bus subsystem 304 is shown schematically as a single bus, alternative embodiments of the bus subsystem can utilize multiple buses. Additionally, network interface subsystem 312 can serve as an interface for communicating data between computer system 300 and other computer systems or networks. Embodiments of network interface subsystem 312 can include wired interfaces (e.g., Ethernet, CAN, RS232, RS485, etc.) or wireless interfaces (e.g., Bluetooth®, BLE, ZigBee®, Z-Wire®, Wi-Fi, cellular protocols, etc.).

In some cases, user interface input devices 314 can include a keyboard (keyboard 140), a presenter, a pointing device (e.g., mouse, trackball, touchpad, etc.), a touchscreen incorporated into a display, audio input devices (e.g., voice recognition systems, microphones, etc.), Human Machine Interfaces (HMI) and other types of input devices. In general, use of the term "input device" is intended to include all possible types of devices and mechanisms for inputting information into computer system 300. Additionally, user interface output devices 316 can include a display subsystem, a printer, or non-visual displays such as audio output devices, etc. The display subsystem can be any known type of display device. In general, use of the term "output device" is intended to include all possible types of devices and mechanisms for outputting information from computer system 300.

Storage subsystem 306 can include memory subsystem 308 and file storage subsystem 310. Memory subsystems 308 and file storage subsystem 310 represent non-transitory computer-readable storage media that can store program code and/or data that provide the functionality of embodiments of the present disclosure. In some embodiments, memory subsystem 308 can include a number of memories including main random access memory (RAM) 318 for storage of instructions and data during program execution and read-only memory (ROM) 320 in which fixed instructions may be stored. File storage subsystem 310 can provide persistent (i.e., non-volatile) storage for program and data files, and can include a magnetic or solid-state hard disk drive, an optical drive along with associated removable media (e.g., CD-ROM, DVD, Blu-Ray, etc.), a removable flash memory-based drive or card, and/or other types of storage media known in the art.

It should be appreciated that computer system 300 is illustrative and not intended to limit embodiments of the present disclosure. Many other configurations having more or fewer components than system 300 are possible. The various embodiments further can be implemented in a wide variety of operating environments, which in some cases can include one or more user computers, computing devices or processing devices, which can be used to operate any of a number of applications. User or client devices can include any of a number of general purpose personal computers, such as desktop or laptop computers running a standard or non-standard operating system, as well as cellular, wireless and handheld devices running mobile software and capable of supporting a number of networking and messaging protocols. Such a system also can include a number of workstations running any of a variety of commercially available operating systems and other known applications for purposes such as development and database management. These devices also can include other electronic devices, such as dummy terminals, thin-clients, gaming systems and other devices capable of communicating via a network.

Most embodiments utilize at least one network that would be familiar to those skilled in the art for supporting communications using any of a variety of commercially available protocols, such as TCP/IP, UDP, OSI, FTP, UPnP, NFS, CIFS, and the like. The network can be, for example, a local area network, a wide-area network, a virtual private network, the Internet, an intranet, an extranet, a public switched telephone network, an infrared network, a wireless network, and any combination thereof.

In embodiments utilizing a network server, the network server can run any of a variety of server or mid-tier applications, including HTTP servers, FTP servers, CGI servers, data servers, Java servers, and business application servers. The server(s) also may be capable of executing programs or scripts in response to requests from user devices, such as by executing one or more applications that may be implemented as one or more scripts or programs written in any programming language, including but not limited to Java®, C, C # or C++, or any scripting language, such as Perl, Python or TCL, as well as combinations thereof. The server(s) may also include database servers, including without limitation those commercially available from Oracle®, Microsoft®, Sybase®, and IBM®.

Such devices also can include a computer-readable storage media reader, a communications device (e.g., a modem, a network card (wireless or wired), an infrared communication device, etc.), and working memory as described above. The computer-readable storage media reader can be connected with, or configured to receive, a non-transitory computer-readable storage medium, representing remote, local, fixed, and/or removable storage devices as well as storage media for temporarily and/or more permanently containing, storing, transmitting, and retrieving computer-readable information. The system and various devices also typically will include a number of software applications, modules, services or other elements located within at least one working memory device, including an operating system and application programs, such as a client application or browser. It should be appreciated that alternate embodiments may have numerous variations from that described above. F or example, customized hardware might also be used and/or particular elements might be implemented in hardware, software (including portable software, such as applets) or both. Further, connections to other computing devices such as network input/output devices may be employed.

Aspects of the Use and Configuration of the User-Manipulable Element

Figure 4A:
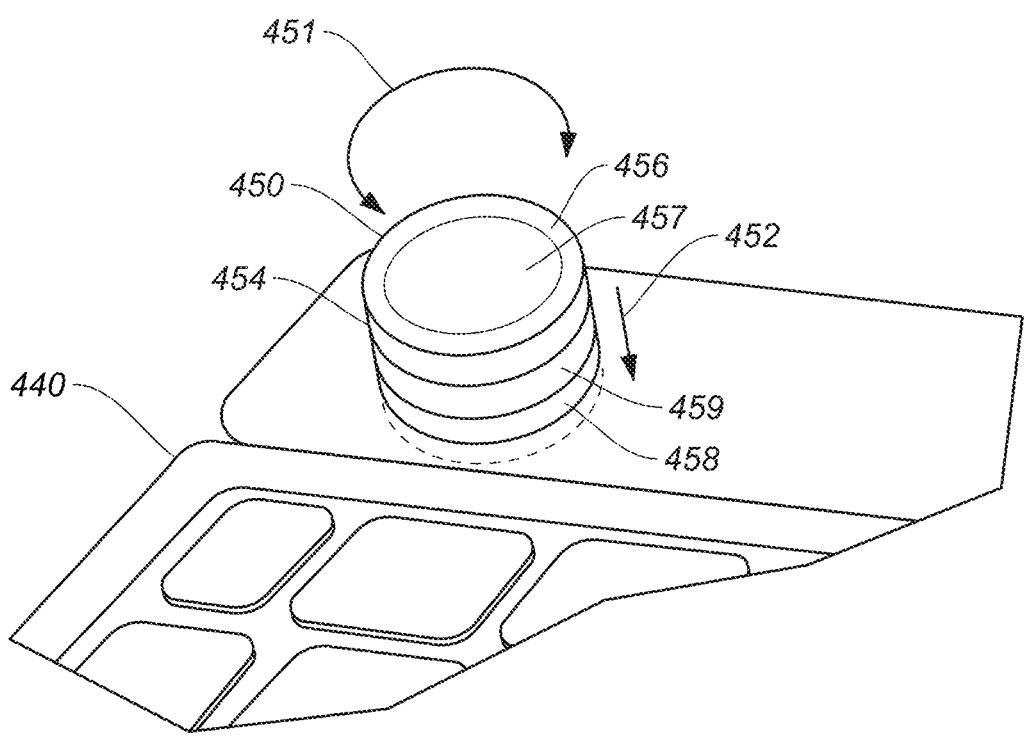
FIG. 4A shows a user-manipulable element, according to certain embodiments.

FIG. 4A shows a user-manipulable element 450, according to certain embodiments. User-manipulable element ("knob") 450 can be disposed on any suitable input device (e.g., keyboard 440) and may include top surface 456 and side surface 458. Top surface 456 may include touch sensor(s) 457 and side surface 458 may include touch sensor(s) 459. Knob 450 can be rotated along path 451 and, in some cases, can be depressible along path 452 to register a "button click" as would be understood by one of ordinary skill in the art.

Figures 4B, 4C:
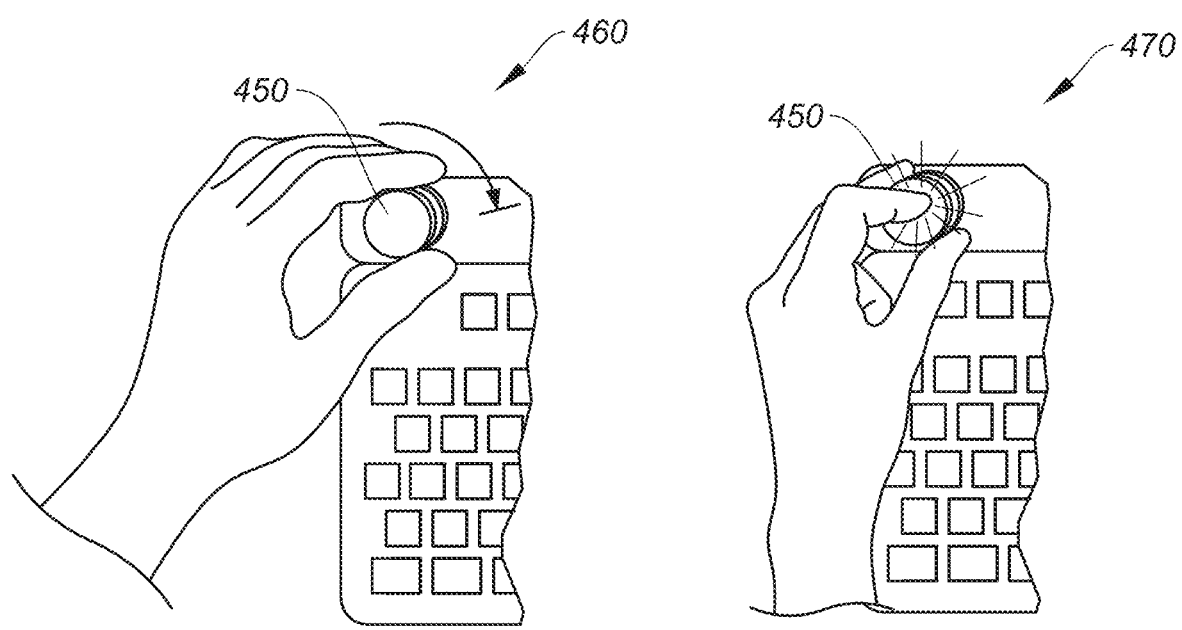
FIG. 4B shows an example of multi-touch detection on a user-manipulable element, according to certain embodiments.
FIG. 4C shows an example of multi-touch detection on a user-manipulable element, according to certain embodiments.

Knob 450 can include various performance characteristics that can be set or controlled locally (e.g., by processor 210), remotely (e.g., via control signal generated by processor(s) 302), or a combination thereof. Some performance characteristics can include a rotation resistance of knob 450, a rotational input resolution of knob 450 (e.g., rotation sensitivity), a depressible knob function, setting a ratchet or non-ratchet mode of operation (e.g., via a magnetic clutch and ratchet system disposed in knob 450—as described below in conjunction with FIGS. 5-7) to knob 450 based on properties of an editable parameter (e.g., associated with a selectable control element on a host computing device—further discussed below). In certain embodiments, touch sensors 457, 459 can detect a single touch or simultaneous touches. For example, FIG. 4B shows an example of multi-touch detection on a user-manipulable element, according to certain embodiments. Specifically, two locations on side sensor 459 can be contacted and simultaneously detected for any suitable functionality. In some cases, multiple touches on top touch sensor 457 may be detected and differentiated. One performance characteristic of touch sensors can include a touch sensitivity (e.g., resolution). In some cases, one or more touch sensors on knob 450 (e.g., sensor 454, 457) can operate as a touch pad. For example, touch sensors 454, 457 can allow a user to control a cursor on a display. In further embodiments, knob 450 can be a standalone device (e.g., not associated with other components). For instance, knob 450 may not be associated with another input device (e.g., keyboard, computer mouse, etc.) and may operate independently (e.g., controlled by system 200).

In certain embodiments, touch sensors 454 and 457 may have similar functions, different functions, or complimentary functions. One example of a complimentary function is that top touch sensor 457 can be used for course adjustments (e.g., large scale zoom) while side touch sensor 454 may control fine adjustments (e.g., small scale zoom), as shown in FIG. 4C. In some cases, top touch sensor 457 can be used to enter a value (see, e.g., FIG. 12A), or open a menu (e.g., pressing sensor 457 opens a visual UI menu allowing a user to switch between functions by rotating knob 450 or selecting with a computer mouse-controlled cursor).

In some cases, a user may want to have a quick-access method of getting back to a global setting, such as a non-context sensitive setting for knob 450. For example, if a user is in a photo editing application and has a specific tool selected, turning knob 450 may change aspects of the selected tool. If the user wants to change a different parameter all together (e.g., volume), pressing down knob 450 (depressing along path 452) and rotating while knob 450 is depressed may be configured to perform an alternative function (e.g., switching to desktop, scroll up/down, volume control, etc.). One of ordinary skill in the art would understand the many variations, modifications, and alternative embodiments thereof.

Rotational resistance can range from no rotational resistance (e.g., no added resistance) to a high resistance to prevent a user from rotating knob 450. For example, if a value of an editable parameter (e.g., brightness) can be adjusted to a setting with a range of values from 0 to 100, knob 450 can be configured to provide a relatively high rotational resistance at each limit. For instance, a rotational resistance may be low (i.e., a user can easily rotate knob 450) from 1-99, and rotational resistance may be high (i.e., a user cannot rotate knob 450 any further) at 0 and 100. In some embodiments, the rotational resistance may follow a particular torque profile such that the rotational resistance is lowest at 50 and increases linearly or non-linearly as the minimum and maximum limits are approached. Any suitable force profile can be applied, as would be understood by one of ordinary skill in the art. Rotational resistance can be referred to as a torque friction, rotational friction, a torque profile (e.g., rotational resistance over a range), or the like.

Ratchet and non-ratchet mode may be set based on any suitable criteria. For example, ratchet mode may better apply to applications that have a finite number of settings, such as a selection of a number of available paint brushes in Photoshop®, a number of font sizes that are available, or the like. A non-ratcheted mode may be well suited for more analog settings that have a continuous or high number of settings, such as a selection of a color from a band of hundreds, thousands, or millions of available colors, a scroll bar (e.g., to scroll through a 100+ page document), a volume, or the like.

Aspects of a Magnetic Ratchet Assembly

Figure 5:
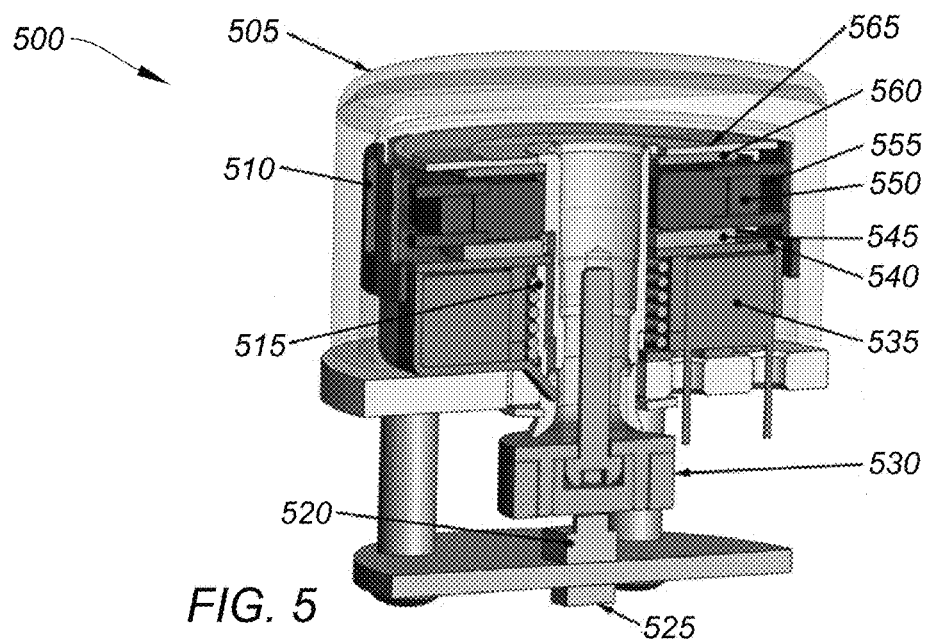
FIG. 5 shows a cutaway view of a user-manipulable element, according to certain embodiments.

FIG. 5 shows a cutaway view of a user-manipulable element ("knob") 500 with a magnetic ratchet system disposed therein, according to certain embodiments. A ratchet system can be used to implement a simulated ratcheting effect on knob 500 when activated. When deactivated, knob 500 may rotate freely with no ratcheting effect. In some embodiments, aspects of the ratcheting including the magnitude of each ratchet (e.g., how much travel between each ratchet "click") and a resistance of the ratchet (e.g., how much force is required to rotate knob 500 in ratchet mode) can be controlled by, for example, processor 210, processor 302, or a combination thereof, as further discussed below. In one example, knob 500 may be configured for a ratcheting mode of operation when a finite or limited number of quantized selections are available and/or low resolution is required. For instance, a font size or font type for alphanumeric text on a GUI may be appropriate. In that case, some users may find that it is intuitive to associate ratcheting or "clicking" with each selection. In another example, knob 500 may be configured for a non-ratcheting mode of operation when a large number of choices are available, high resolution is required, or a continuous gradient or scale of values can be selected. A ratcheting mode, even with high resolution (e.g., small "clicks") would necessarily skip certain values in a continuous spectrum of choices. A non-ratcheting mode can allow a user to select any value with high precision, which may be desirable in certain situations (e.g., selecting a color for a 3D model in a continuous spectrum of available colors). One of ordinary skill in the art would understand the many variations, modifications, and alternative embodiments thereof.

Figure 6:
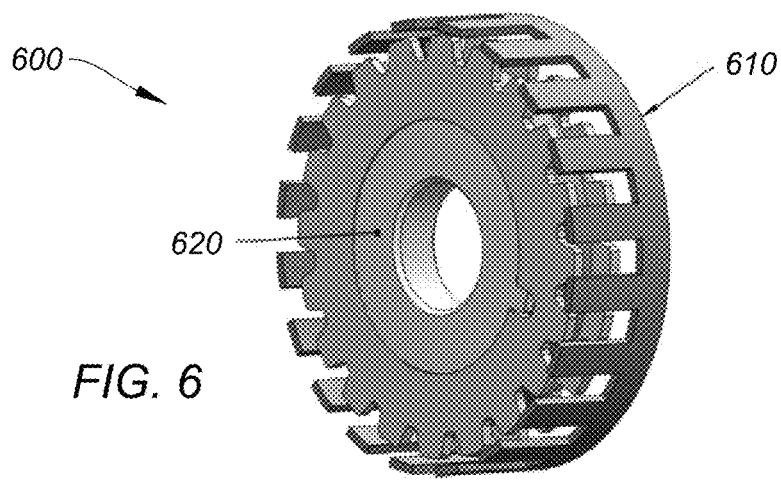
FIG. 6 shows a magnetic ratchet for a user-manipulable element, according to certain embodiments.
Figure 7:
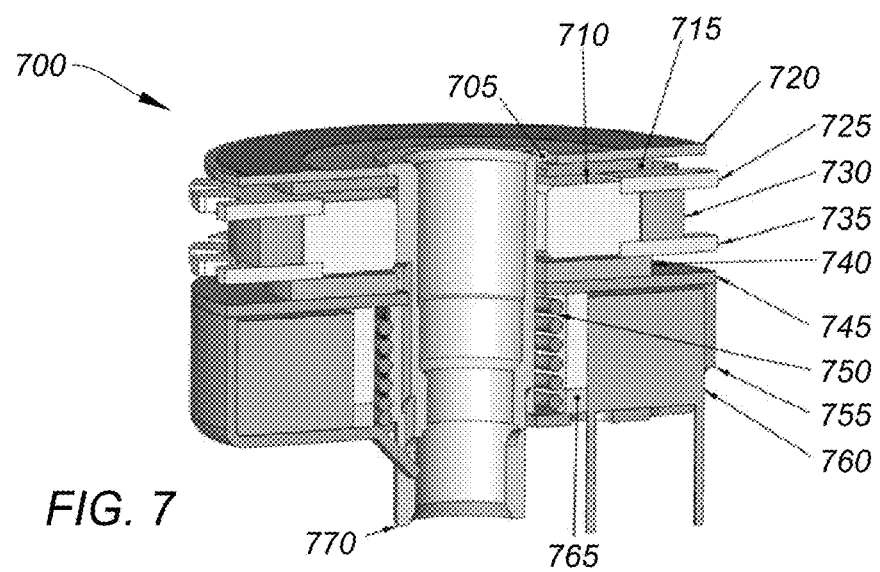
FIG. 7 shows a bi-stable clutch mechanism for an input device, according to certain embodiments.

In certain embodiments, a ratcheting effect is implemented via knob 500, as shown and described with respect to FIGS. 5-7 and the accompanying Appendix. In some embodiments, a knob with an embedded magnetic ratcheting system may include a magnetic ratchet, a clutch including a fixed disc and a mobile friction disc, a bi-stable electromagnetic clutch actuator, a magnetic angular sensor, a switch actuated by axial displacement of the knob, and a proximity detector electrode on the shaft end. Referring to FIG. 5, knob 500 includes knob portion 505, knob ratchet armature 510, switch 520, angular sensor 525, angular sensor magnet 530, bi-stable electromagnetic clutch actuator 535, clutch control mobile armature 540, non-magnetic clutch disc 545, switchable magnetic wheel 550, ratchet assembly 555, fixed friction disc 560, and printed circuit board (PCB) with electrode proximity detection 565. The operation of which would be understood by one of ordinary skill in the art with the benefit of this disclosure.

FIG. 6 shows magnetic ratchet 600 for a user-manipulable element, according to certain embodiments. In some embodiments, magnetic ratchet 600 can include two similar armatures with teethed wheels and a ring magnet assembled on a plastic rim. Improved torque efficiency can be obtained with two air gaps contributing to a reluctance variation. Magnetic ratchet 600 is shown with knob armature 610, and armature magnet assembly 620, which can be free or locked. The operation of which would be understood by one of ordinary skill in the art with the benefit of this disclosure.

FIG. 7 shows a bi-stable clutch mechanism 700 for an input device (e.g., knob 450), according to certain embodiments. A bi-stable function of the actuator may be obtained by adding a non-linear force of a reluctant magnetic circuit loaded by a ring magnet and a nearly constant force of a helicoidal spring (see, e.g., the Appendix). In some implementations, the spring force can contribute to brake the teethed armatures to achieve the ratcheting effect by pushing against the clutch disc. When the ratchet is off, the magnetic reluctance force may be higher than the spring force, causing the magnetic circuit to remain closed and allowing the ratchet wheel to turn freely. In some embodiments, a non-magnetic clutch disc can be placed between the ratchet wheel (teethed armatures) and the clutch control armature to separate the two magnetic circuits. In some cases, the non-magnetic clutch disc can also be used to adapt the gap of the control system because the other parts stacked on the shaft may not be able to be controlled with tight tolerances. The clutch position can be controlled by means of a coil. To switch off the ratchet effect, a negative current can be fed into the coil to produce a pulling force on the clutch control armature (e.g., moving clutch disc), which can be higher than the spring force. Referring to FIG. 7, bi-stable clutch mechanism 700 can include a passage for an electrode wire 705, a plastic ratchet bearing 710, a clutch fixed magnetic disk 715 (e.g., crimped on the shaft), a PCB with electrode 720, teeth armature 725, ratchet ring magnet 730, teeth armature 735, non-magnetic clutch disc 740, clutch control armature 745, spring 750, coil bell armature 755, coil 760, ring magnet 765 and shaft 770. The operation of which would be understood by one of ordinary skill in the art with the benefit of this disclosure.

Although many of the embodiments described herein use an electro-magnetic actuator to implement the ratchet/non-ratchet functions, it should be understood that other implementations may use different mechanisms to provide a controllable ratchet function. For instance, some embodiments may employ mechanical/friction ratchet mechanisms that can be actuated by a direct current (DC) motor (e.g., see Appendices). One of ordinary skill in the art with the benefit of this disclosure would understand the many variations, modifications, and alternative embodiments thereof.

At a high level of abstraction, software operating on a host computing device (e.g., executed by processor 302) typically manages mapping functions (e.g., mapping editable parameters associated with selectable control elements with user-manipulable element (e.g., knob 450) on an input device, as further discussed below) and interfacing between computer software running on the host computing device (e.g., Photoshop®) and the connected input device (e.g., knob 450). Alternatively or additionally, some management may be performed, in part, by aspects (e.g., processor 210) of the corresponding input device. From a user perspective, the user-manipulable element may be associated with the graphical element closest to a cursor on a display. For example, as a user moves a cursor toward a first graphical element (e.g., selectable control element), knob 450 can be dynamically programmed to control an editable parameter (e.g., font type) associated with that graphical element. Similarly, as the user moves the cursor towards a second selectable control element, knob 450 may be automatically and dynamically programmed to control an editable parameter (e.g., volume) associated with the second selectable control element. Alternatively or additionally, associating the user-manipulable object with the editable parameter of a selectable control element can be based on other criteria other than a location of a cursor. For example, a selectable control element may be selected to be associated with a user-manipulable object based on historical usage. Thus, a "most used" selectable control element may be selected irrespective of the location of the cursor. Other methods of selection are possible, as would be understood by one of ordinary skill in the art. The following embodiments describe just some of the many embodiments that fall within the purview of this disclosure.

Figure 8:
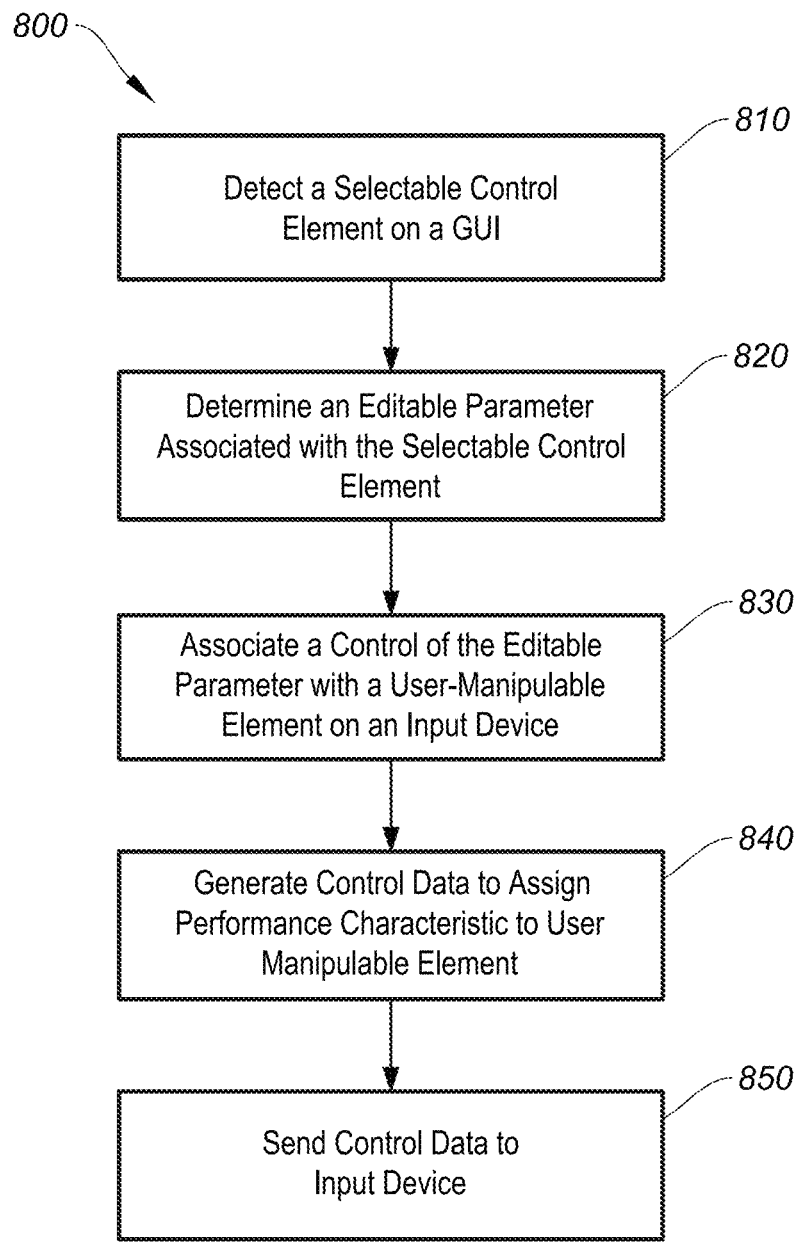
FIG. 8 shows a simplified flow diagram for associating a function with a user-manipulable element on an input device, according to certain embodiments.

FIG. 8 shows a simplified flow diagram 800 for associating a function with a user-manipulable element on an input device, according to certain embodiments. Method 800 can be performed by processing logic that may comprise hardware (circuitry, dedicated logic, etc.), software operating on appropriate hardware (such as a general purpose computing system or a dedicated machine), firmware (embedded software), or any combination thereof. In certain embodiments, method 800 can be performed by processor 302 of system 300, as shown and described above with respect to FIGS. 1 and 3.

At step 810, method 800 can include detecting, by a processor 302 on a host computing device 110, a selectable control element on a graphical user interface (GUI), according to certain embodiments. A GUI can be a graphical window, virtual desktop, applications, or any image on a display (e.g., display 120) that a user can interact with. A selectable control element can include any graphical element that can be controlled by a user. For example, some common selectable control elements can include desktop or window-based selectable icons, scroll bars, task bar elements, tabs, text, media players, media player controls (e.g., volume, pan, bass/treble, media transport controls, etc.), hyperlinks, or the like. One of ordinary skill in the art would understand the many possible types of selectable control elements that could be selectable on a GUI. In some embodiments, some control elements may not be "selectable" such that a user cannot manipulate or interact with the control element. For instance, a web page or PDF document may have a single page with no controllable element (e.g., no scroll bar). In such instances, non-selectable elements, such as alphanumeric text may be detected and used as described herein. In further embodiments, certain control elements may not be "selectable" from a current view and may be nested in various dropdown menus or interfaces. For example, a media player may include different skins (e.g., background images) with a selectable list of skins (i.e., the control element) buried in a nested menu. In such instances, the control element is not immediately selectable in a current view (outside of the corresponding menu bar), but can be detected nonetheless by host computing device 110. In certain embodiments, software configuring knob 450 may access particular software operating on the host computing device to determine what elements are included in a particular window. For instance, presentation software can be accessed to determine what is included in each particular slide (e.g., embedded hyperlinks, spreadsheets, images, etc.), which is readily available and easily accessible as would be understood by one of ordinary skill in the art. Similarly, photo editing software (e.g., Photoshop®) can be accessed to determine what selectable control elements (e.g., icons, menus, etc.) are available. It should be understood that the various methods of identifying elements described with respect to FIG. 8 can be applied to any of the figures, embodiments, systems, or methods, etc., described herein, as would be understood by one of ordinary skill in the art.

At step 820, method 800 can include determining, by processor 302, an editable parameter associated with the selectable control element, according to certain embodiments. An editable parameter can be any adjustable value, setting, mode of operation, or the like, associated with the selectable control element. For example, a selectable control element can be alphanumeric text and the editable parameter can include a font size, font type, font color, text position (e.g., text can be moved on the display in an x and y direction), or the like. In another example, a media player can be the selectable control element and the editable parameter can include a volume, pan, bass/treble settings, media transport controls, and the like. In a further example, a photo may be the selectable control element and the editable parameters can include a zoom (magnification), pan control, brightness, contrast, filter selection, etc. One of ordinary skill in the art would understand the many variations, modifications, and alternative embodiments of possible selectable control elements and editable parameters.

At step 830, method 800 can include associating a control of the editable parameter with user-manipulable element 150 on an input device 140, according to certain embodiments. User-manipulable element 150 can be a knob, button, scroll wheel, trackball, joystick, slider, or the like, as would be understood by one of ordinary skill in the art. One example of associating a control of the editable parameter with user-manipulable element 150 (knob 150) can include associating a font-size selection for alphanumeric text on display 120 with knob 150. More non-limiting examples of are provided in FIGS. 9-13C. The examples provided herein generally describe associating a control of the editable parameter with a single user-manipulable element 150. Some embodiments may associate the editable parameter with multiple user-manipulable elements 150. In some cases, the same editable parameter for a selectable control element can be associated with different user-manipulable elements 150 based on certain contexts. For instance, a volume control on a media player may be associated with knob 150 during typical use, but may opt to associate the volume control with a slider or touch sensor on keyboard 140 when certain applications (e.g., digital audio workstation) are in use to, for example, make knob 150 available for other purposes. Control data and control signal can be used interchangeably throughout this disclosure.

At step 840, method 800 can include generating control data to assign a performance characteristic to user-manipulable element 150 based on properties of the editable parameter. The control data can be in any suitable format that can control aspects (e.g., user-manipulable element 150) of input device 140, as would be understood by one of ordinary skill in the art. A performance characteristic for knob 150 can include a rotation resistance of the knob, a rotational input resolution of the knob (e.g., rotation sensitivity), setting a ratchet or non-ratchet mode of operation for the knob (e.g., via an internal magnetic clutch) based on the properties of the editable parameter, or a depressible feature (e.g., knob 150 can be depressed like a button click). For buttons, touch sensors, sliders, or any other user-manipulable element 150, editable parameters can include button sensitivity, touch sensitivity, haptic feedback intensity, or the like. One of ordinary skill in the art would understand the many variations, modifications, and alternative embodiments thereof. Steps 830 and 840 can be separate steps or can be performed in a single step (e.g., generating control data to both associate an editable parameter with a user-manipulable element and assign a performance characteristic to the user-manipulable element. At step 850, method 800 can include sending, by the host computing device (e.g., processor 302), the control signal to the input device (e.g., processor 210).

It should be appreciated that the specific steps illustrated in FIG. 8 provide a particular method 800 for assigning a function to a user-manipulable element on an input device, according to certain embodiments. Other sequences of steps may also be performed according to alternative embodiments. For example, alternative embodiments may perform the steps outlined above in a different order. Moreover, the individual steps illustrated in FIG. 8 may include multiple sub-steps that may be performed in various sequences as appropriate to the individual step. Furthermore, additional steps may be added or removed depending on the particular applications. For example, method 800 can further include receiving a first input data corresponding to a rotation of the knob, receiving a second input data corresponding to the rotation of the knob, and applying the first input data and second input data to the editable parameter as a single continuous input when the first and second inputs are received within a threshold time. In this example, a user may turn knob 150 by 180 degrees, let go of knob 150, and re-grab knob 150 to turn it for an additional 70 degrees (e.g., if the user cannot sufficiently turn knob 150 in a single turn). To determine whether the user intended the two turns to be separate or treated as a single continuous turn, a threshold time (e.g., less than 1 second) can be tracked between each input. For multiple inputs that occur within the threshold time, the inputs can be treated as a single continuous input. Any suitable threshold time can be used, which may be shorter or longer that the examples provided herein.

In another example, method 800 can further include receiving, by processor 302, input data corresponding to a movement of a cursor on the GUI, where the detecting the selectable control element on the GUI occurs in response to detecting when the cursor is placed over the selectable control element. One of ordinary skill in the art would recognize and appreciate many variations, modifications, and alternatives of method 800.

Figure 9:
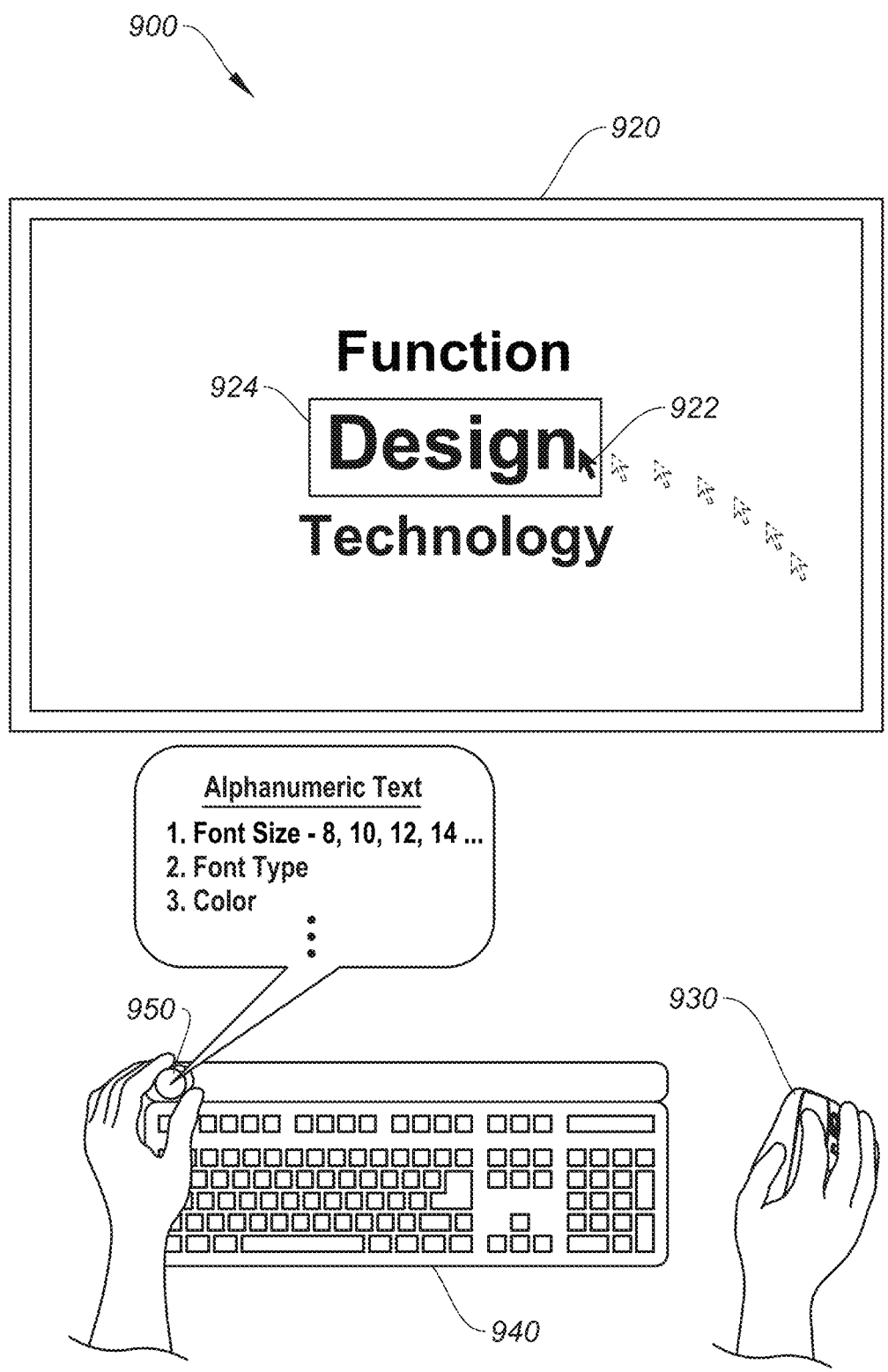
FIG. 9 shows aspects of associating a function with a user-manipulable object, according to certain embodiments.

FIG. 9 shows aspects of a system 900 for associating a function with an input device that corresponds to a selectable control element on a display, according to certain embodiments. More specifically, a user manipulates first input device 930 (e.g., computer mouse, presenter, etc.) to move cursor 922 over selectable control element ("text") 924 on display 920. The host computer (e.g., host computer 110) can then detect control element 924, determine certain editable parameters associated with text 924, associate a control of the editable parameter with a user-manipulable element (e.g., knob 950) on a second input device (e.g., keyboard 940) and generate a control signal to cause the second input device (e.g., processor 210 of keyboard 940) to assign a performance characteristic (e.g., knob rotation) to the user-manipulable element based on properties of the editable parameter. For instance, text 924 can include editable parameters such as font size and font type, which can include a number of discrete values. Thus, processor 302 may determine that a rotation function would be better suited to cycle through available values (e.g., font sizes 8-72) then successive button presses (e.g., depressing knob 950) or successive touch sensor touches (e.g., touch sensor 457) may be. In some embodiments, processor 210 of input device 940 may determine the appropriate user-manipulable element to apply, while host computer 110 merely sends a control signal indicating what editable parameters need to be assigned. In some cases, the assignment can be controlled, in part, by both processors 302 and 210. One of ordinary skill in the art with the benefit of this disclosure would understand the many variations, modifications, and alternative embodiments thereof.

In some embodiments, multiple editable parameters can be associated with a user-manipulable element (e.g., rotation of knob 950) and prioritized in a hierarchical fashion. Referring to FIG. 9, a font size, font type, and font color are associated with alphanumeric text 924 and assigned to knob 950, respectively. In certain aspects, a user can cycle through and switch between each editable parameter. For instance, a detected touch on a touch sensor (e.g., sensor 457) may execute a switch from font size to font type. A subsequently detected touch on the touch sensor may cause a switch from font size to font color, and so on. One of ordinary skill in the art would understand the many variations, modifications, and alternative embodiments thereof.

The example shown in FIG. 9 shows a user manually selecting control element ("text") 924. Alternatively or additionally, system 900 may automatically select a selectable control element without requiring user interaction. Automatic selection can be performed based on any suitable criteria, such as a hierarchy of preferred editable parameters, by machine learning based on previous user selections and interactions, by application-based preset conditions, or the like, and by any combination thereof.

FIG. 10 shows aspects of associating a function with a user-manipulable object 150 on an input device 1040, according to certain embodiments, and includes display 1020 (e.g., operated by aspects of system 300), keyboard 1040 (e.g., operated by aspects of system 300), and knob 1050. As described above, a ratchet or non-ratchet mode of operation can selectively be applied to a user-manipulable control based on properties of a corresponding editable parameter. In some cases, it may be advantageous to apply a ratchet mode of operation to knob 1050 when alphanumeric text is detected on display 1020, as a limited number of discrete settings (e.g., font size, font type, number of brushes, number of selectable tabs, etc.) may be more intuitively controlled with discrete positions on knob 1050. Referring to FIG. 10, as knob 1050 is rotated clockwise, larger discrete font sizes (or any suitable editable parameter associated with a detected selectable control element) are applied to the corresponding text (e.g., selectable control element) on display 1020. In alternative embodiments, font size or font type could, for example, be associated with knob 1050 having the ratchet mode turned off such that the rotation of knob 1050 is smooth and changes in the underlying editable parameter can be configured to change between values as knob 1050 is rotated a certain distance (e.g., switch values every 20 degree rotation). In some embodiments, multiple performance characteristics may be associated with a single editable parameter. For instance, knob 1050 may be configured to control a font type as knob 1050 is rotated, a ratchet mode may be applied, and a resistance of rotation may be configured to increase or decrease as the selected values increase or decrease. One of ordinary skill in the art would understand the many variations, modifications, and alternative embodiments thereof.

In some embodiments, the number of ratchet positions in 360 degrees of rotation can be controlled by software operating on host computing device (e.g., via method 800). In some cases, a ratchet torque (e.g., rotational resistance) can be configured to correspond to a number of ratchet positions. For example, a low number of ratchet positions (e.g., line width) may have a higher relative rotational resistance associated with it (e.g., harder for a user to rotate knob 1050), while a high number of ratchet positions (e.g., number of brushes) may have a lower relative rotational resistance associated with it (e.g., easier for a user to rotate knob 1050). Some embodiments can include very high rotational resistance when a minimum or maximum software value is reached to indicate to the user that the corresponding parameter (e.g., volume) cannot be increased or decreased beyond a current value. In some cases, a default value may have a higher rotation resistance than adjacent ratchet settings to indicate a center position, default value, preferred setting, or the like. One of ordinary skill in the art would understand the many variations, modifications, and alternative embodiments thereof.

FIG. 11 shows aspects of associating a function with a user-manipulable object 1150 on an input device 1140, according to certain embodiments, and includes display 1120 (e.g., operated by aspects of system 300), keyboard 1140 (e.g., operated by aspects of system 300), and knob 1150. As described above, a ratchet or non-ratchet mode of operation can selectively be applied to a user-manipulable control based on properties of a corresponding editable parameter. In some cases, it may be advantageous to apply a non-ratchet mode of operation to knob 1150 when an image is detected on display 1120 and a corresponding editable parameter has a very high number of settings (e.g., continuous, high resolution color gradient). In such cases, it may be more intuitively controlled with a continuous rotation on knob 1150. Referring to the non-limiting example shown in FIG. 10, as knob 1150 is rotated clockwise, value indicator 1165 can increase as it moves to the right on color gradient selection bar 1160. Typically, non-ratchet conditions may be well-suited for editable parameters that have high granularity, sensitive adjustments, or the like. Alternatively, some embodiments may employ a ratchet mode of operation to select colors. One of ordinary skill in the art would understand the many variations, modifications, and alternative embodiments thereof.

In certain embodiments, a non-ratchet mode may be applied to provide a user with an "analog" control over the associated editable parameter. In some cases, the friction torque (e.g., rotational resistance) of knob 1150 can depend on the software parameter type (e.g., editable parameter). For instance, scrolling in a large document may cause knob 1150 to be configured in non-ratchet mode with a low rotational resistance (e.g., for fast scrolling), while a volume control (e.g., selectable control element) may cause knob 1150 to have a high rotational resistance (e.g., to prevent inadvertent large changes in volume). Rotational resistance may be set to a maximum value when a minimum or maximum value for an editable parameter is met (e.g., scroll at top or bottom of document). In some cases, a default value may have a higher rotational resistance than adjacent settings of knob 1150 to give the impression of a single ratchet "dip" at a default position. One of ordinary skill in the art would understand the many variations, modifications, and alternative embodiments thereof.

Figure 12B:
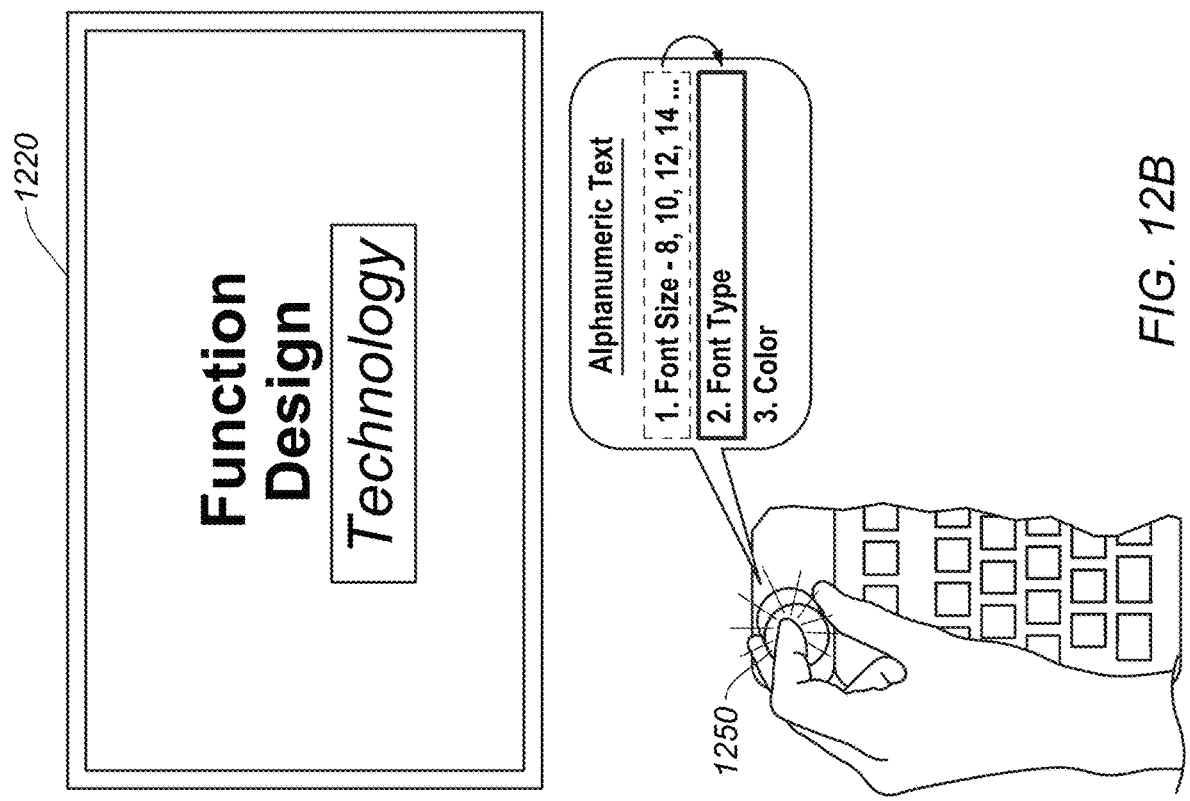
FIG. 12B shows aspects of associating a function with a user-manipulable object on an input device, according to certain embodiments.
Figure 12A:
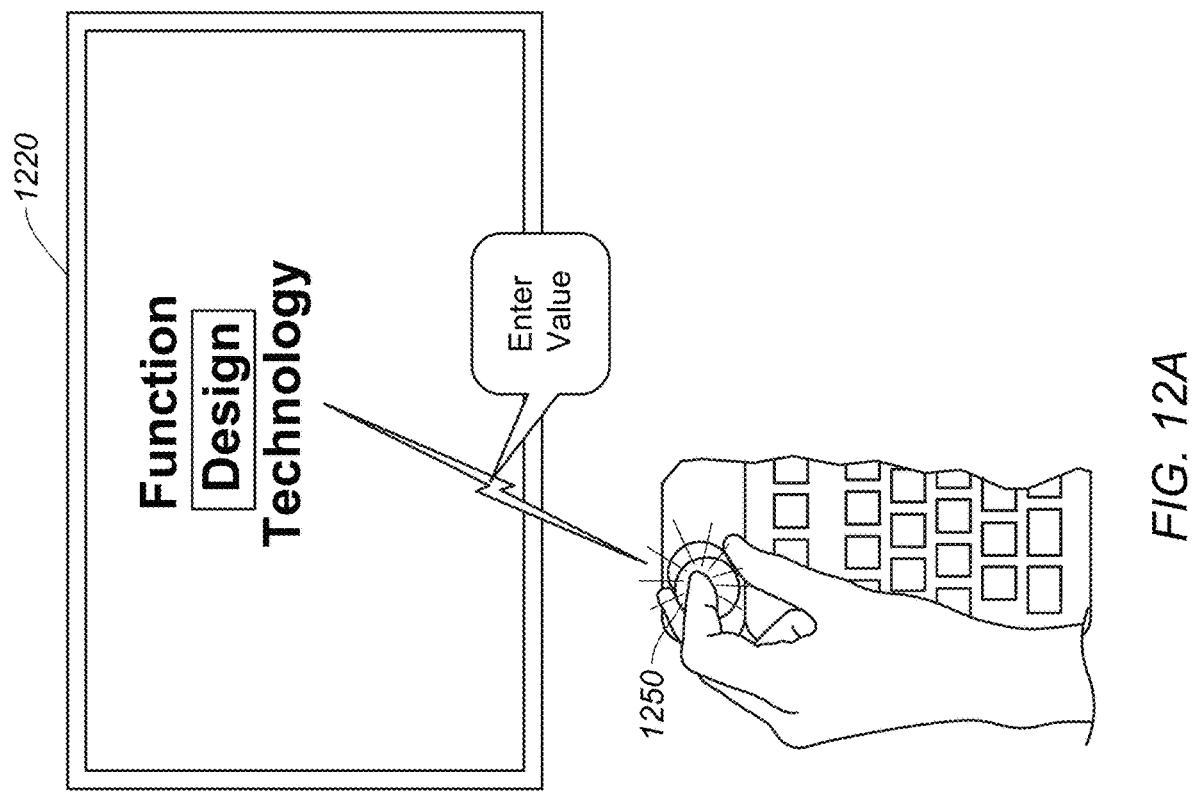
FIG. 12A shows aspects of associating a function with a user-manipulable object on an input device, according to certain embodiments.

FIG. 12A shows aspects of associating a function with a user-manipulable object on an input device, according to certain embodiments. In certain situations, a user may want to cycle through a number of settings and/or values to determine a preferred outcome without necessarily entering the value until they are sure of their selection. In such cases, a touch sensor (e.g., touch sensor 457) disposed on knob 1250 can be configured to enter a currently selected value when touched. Referring to FIG. 12A, the alphanumeric text "design" is selected and the user is manipulating knob 1250 to set a particular value for a corresponding editable parameter (e.g., font size). The user can then tap the touch sensor on knob 1250 to "enter" the value selected, thereby confirming a user intent to apply a specific setting. In some embodiments, processor 210 may receive the touch sensor input signal and relay the signal to the corresponding host computing device (e.g., host computer 110) to apply the setting. Alternatively or additionally, the control signal from the host computer that initially detected the "design" text and determined one or more associated editable parameters may cause the touch sensor of knob 1250 to control the "enter value" function as described above. In some cases, the control signal may provide the editable parameters and the input device (e.g., processor 210) may select and control which user manipulable element is assigned the "enter value" function. One of ordinary skill in the art would understand the many variations, modifications, and alternative embodiments thereof.

FIG. 12B shows aspects of associating a function with a user-manipulable object on an input device, according to certain embodiments. In certain situations, a user may want to switch between editable parameters to achieve a particular setting for the selectable control element. In such cases, a touch sensor (e.g., touch sensor 457) disposed on knob 1250 can be configured to switch between selectable elements associated with a currently selected control element. Referring to FIG. 12B, the alphanumeric text "technology" is selected. In response to the user touching the touch sensor, the selected editable parameter switches from font size to font type, and subsequent rotations of knob 1250 change the font type accordingly. In some embodiments, processor 210 may receive the touch sensor input signal and relay the signal to the corresponding host computing device (e.g., host computer 110) to apply the setting. Alternatively or additionally, the control signal from the host computer that initially detected the "design" text and determined one or more associated editable parameters may cause the touch sensor of knob 1350 to control the "enter value" function as described above. In some cases, the control signal may provide the editable parameters and the input device (e.g., processor 210) may select and control which user manipulable element is assigned the "switch" function. In some embodiments, the switching function (or any function) can be associated with other controls, keys, etc. (e.g., assigned hot keys, function keys, etc., of a corresponding input device).

Some embodiments may associate other functions with the one or more touch sensors on knob 1250. For instance, short presses, long presses, multiple presses, and the like, can be configured to cause different functions to occur. In some cases, a single short press may implement validation (e.g., enter a value of an editable parameter—as described above), a long press may switch the editable parameter of the corresponding selectable control element, and a double tap may change a position in a menu hierarchy (e.g., switching from a first level including fonts, colors, and tools, to a lower level of fonts including font size and font type). One of ordinary skill in the art would understand the many variations, modifications, and alternative embodiments thereof.

Proximity detection can be used with the one or more touch sensors, according to certain embodiments. For instance, power management functions (e.g., operated by power management system 230) may be associated with proximity detection where the supporting electronics for knob 1250 can turn on when a user's hand is determined to be in close proximity, which may be advantageous for power sensitive cordless input devices (e.g., keyboards, computer mice, etc.). One of ordinary skill in the art would understand the many variations, modifications, and alternative embodiments thereof.

FIGS. 13A-C show aspects of associating a function with a user-manipulable object, according to certain embodiments. FIGS. 13A-C include display 1320 with a selected control element (e.g., gray scale gradient bar), a knob 1350 on an input device, and a corresponding touch sensitive region 1354 around a side portion or perimeter of knob 1350. In some cases, a user may wish to adjust an editable parameter associated with knob 1350 to a value that they cannot reach with a single rotation. In some configurations, an adjusted value may revert back to a default value when a user let's go of knob 1350 (e.g., touch sensor 1354 may detect that a user is no longer touching knob 1350). This may be the case when entering a value occurs in response to touching a touch sensor, as discussed above with respect to FIG. 12A. With this setting, it can be cumbersome and inefficient is a user has to keep their fingers on a touch sensor while trying to rotate a knob beyond 270 degrees or more, for example. One solution may be to tap touch sensor 1250 half way through the rotation to "save" the setting and then re-grip the knob to continue the rotation.

In certain embodiments, a threshold time can be used to determine when an input is intended to be completed. For instance, in FIG. 13A, the user rotates knob 1350 approximately 100 degrees causing an adjustment of a gray-scale gradient bar on display 1320. In FIG. 13B, the user let's go of knob 1350 and repositions his hand to continue rotating knob 1350, causing adjustment of the gradient bar to pause. In FIG. 13C, the user continues the rotation of knob 1350 for an additional 100 degrees, thereby causing the adjustment of the gradient bar to continue. In some embodiments, if the time between the user letting go of knob 1350 in FIG. 13B and re-gripping knob 1350 in FIG. 13C is less than a threshold time (e.g., 2 seconds), then the adjustments of FIGS. 13A and 13C are treated as a continuous adjustment and the default auto-reset function mentioned above would be avoided. The threshold time can be any suitable value and may be shorter or longer than the examples provided herein. Thus, in certain embodiments, processor 210 can receive a first input data corresponding to a rotation of knob 1350, receive a second subsequent input data corresponding to the rotation of knob 1350, and apply the first input data and second input data to a corresponding editable parameter as a single continuous input when the first and second inputs are received within the threshold time.

In some embodiments, touch sensors 1354 can detect multiple simultaneous touches (e.g., thumb, forefinger, and middle finger detection when adjusting knob 1350), which can be useful for location-dependent touch detection. For instance, some embodiments may increase a sensitivity of the adjustment of an editable parameter when a user grips knob 1350 with three fingers instead of two. In some cases, a memory buffer (e.g., memory array 220 or 308) can be used to store how certain users interact with knob 1350. For instance, a first user may typically use two fingers at diametrically opposed locations on knob 1350 (i.e., user grip profile), while a second user may typically grip knob 1350 with three fingers, or with two fingers at different non-diametrically opposed locations. In such instances (e.g., through machine learning via processor 210 and/or 302), certain editable parameters with particular sensitivities may be assigned to knob 1350 in response to detecting a particular selectable control element when the first user is determined to be interacting with knob 1350 (e.g., based on previous first user interactions), and different editable parameters with different sensitivities may be assigned to knob 1350 in response to detecting the selectable control element when the second user is determined to be interacting with knob 1350 (e.g., based on the grip profile). One of ordinary skill in the art would understand the many variations, modifications, and alternative embodiments thereof.

Figure 14:
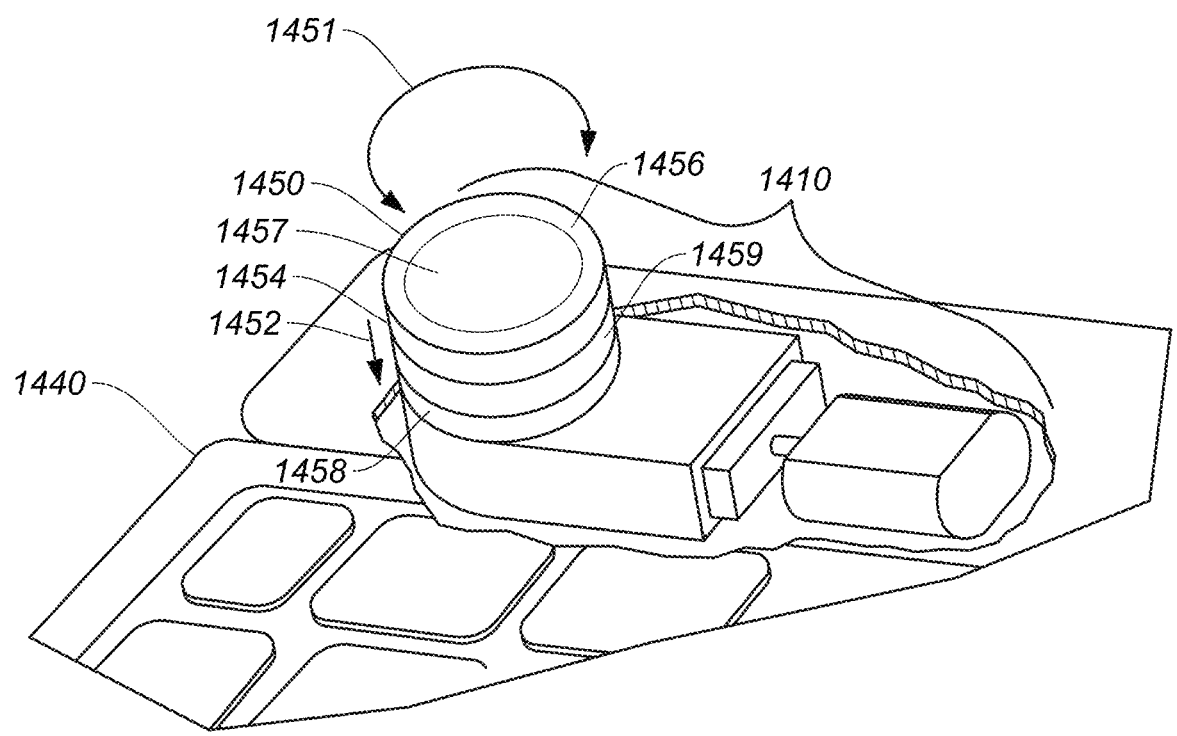
FIG. 14 shows a cut away view of a typical arrangement for a smart-shift mechanical ratchet system for a knob implemented in a keyboard, according to certain embodiments.

Aspects of a Smart Shift Mechanical Ratchet System for a User Manipulable Element In certain embodiments, a smart shift mechanical ratchet system, as described below at least with respect to FIGS. 14-21, provides for a dynamic software-controlled operation of a user manipulable element (e.g., a "knob") capable of switching between a ratcheted mode of operation and a resistance mode (e.g., non-ratcheted mode) of operation based on a contextual usage, similar to knob 450 of FIG. 4. Although the discussion is primarily focused on shifting between a ratcheted and non-ratcheted mode of operation, it should be understood that embodiments utilizing the smart-shift mechanical ratchet assembly can incorporate any other aspects described herein, including but not limited to, one or more touch sensors, stand-alone operation (i.e., no corresponding input device), "button-click" operation, or the like. FIG. 14 shows knob 1450 disposed on keyboard 1440, however knob 1450 may be disposed on other types of input devices including computer mice, game controllers, remote controls, tablet computers, virtual or augmented reality devices, wearable devices, lap top computers, netbook computers, or the like.

FIG. 14 shows a cut away view of a typical arrangement for a smart-shift mechanical ratchet system 1410 for a knob 1450 implemented in a keyboard (1440), according to certain embodiments. Knob 1450 can be disposed on any suitable input device (e.g., keyboard 1440) and may include top surface 1456 and side surface 1458. Top surface 1456 may include touch sensor(s) 1457 and side surface 1458 may include touch sensor(s) 1459. Knob 1450 can be rotated along path 4151 and, in some cases, can be depressible along path 1452 to register a "button click" as would be understood by one of ordinary skill in the art.

Knob 1450 can include various performance characteristics that can be set or controlled locally (e.g., by processor 210), remotely (e.g., via control signal generated by processor(s) 302), or a combination thereof. Some performance characteristics can include a rotation resistance (e.g., of knob 1450), a depressible knob function, or setting a ratchet or non-ratchet mode of operation (e.g., via smart-shift mechanical ratchet system 1410) of knob 1450 based on properties of an editable parameter (e.g., associated with a selectable control element on a host computing device). In further embodiments, knob 1450 can be a standalone unit. For instance, knob 1450 may not be associated with another input device (e.g., keyboard, computer mouse, etc.) and may operate independently (e.g., controlled by system 200 operating the smart-shift mechanical ratchet assembly).

Rotational resistance can range from no rotational resistance (e.g., no added resistance) to a high rotational resistance to prevent a user from rotating knob 1450, as described above with respect to FIG. 4 (including all of its corresponding permutations). The rotational resistance (e.g., in non-ratchet mode) may follow a particular torque profile such that the rotational resistance is lowest at a center position (e.g., a value of 50 out of 100) and increases linearly or non-linearly as the minimum (e.g., 0 of 100) and maximum (e.g., 100 of 100) limits are approached. Any suitable force profile can be applied, as would be understood by one of ordinary skill in the art. Rotational resistance can be referred to as a torque friction, rotational friction (or just "friction"), a torque profile (e.g., rotational resistance over a range), or the like. Furthermore, the ratchet and non-ratchet mode may be set based on any suitable criteria (see, e.g., the description of FIG. 4).

FIG. 15A shows a simplified overall cutaway view of a smart-shift mechanical ratchet system 1500 for a knob (e.g., knob 450), according to certain embodiments. FIG. 15B shows a cutaway plan view of aspects of smart-shift mechanical ratchet system 1500 according to certain embodiments. Smart-shift mechanical ratchet system ("SMRS") 1500 can include knob housing 1510, knob shaft ("first shaft") 1520, ratchet wheel 1530 with toothed perimeter 1535, and ratchet arm 1540 which can include pivot point 1542, compression spring(s) (not visible in FIG. 15A; see, e.g., FIG. 19) and wheel contact region 1546 (not visible in FIG. 15A; see, e.g., FIG. 18A-18B). SMRS 1500 can further include resistance wheel 1550 having smooth perimeter 1555, resistance arm 1560 that may include pivot point 1562, compression spring(s) 1564, wheel contact region 1566, cam shaft ("second shaft") 1570 that may include first cam 1572 (configured to contact ratchet arm 1540), second cam 1574 (configured to contact resistance arm 1560), and third cam 1576, brake system ("obstruction") 1578 (defining and limiting the movement range of third cam 1576), motor 1580, and switch 1515. Motor 1580 can be communicatively coupled to one or both of processors 210, 302 (see, e.g., FIGS. 2-3) and may be automatically and/or dynamically controlled (e.g., based on contextual usage as discussed above with respect to FIGS. 1-13). For example, a mode of operation (e.g., ratchet mode or resistance mode) and a corresponding intensity can be set for SMRS 1500 by controlling cam shaft 1570 and cams 1572-1576, as further discussed below with respect to FIGS. 16A-21. The intensity may include how much or how little of the underlying effect (e.g., ratchet or resistance mode) is applied. SMRS 1500 may be controlled by a host computer system 300, input device system 200, or a combination thereof (see, e.g., method 2200 of FIG. 22). Further, switch 1515 can be actuated when the knob is depressed, as discussed above at least with respect to FIG. 4.

In some embodiments, compression spring(s) (e.g., compression spring 1564) can be adjustable (e.g., processor controlled) to increase or decrease an amount of force provided to ratchet arm 1540 and/or resistance arm 1560. For example, increasing the amount of force on ratchet arm 1540 may increase an intensity of a ratcheted rotation effect on the knob. Decreasing the amount of force on ratchet arm 1540 may decrease the intensity of the ratcheted rotation effect on the knob. The same principle can be applied to the resistance arm. The operation of the ratcheting and resistance systems are further discussed below with respect to FIG. 16A-17B. Adjustable compression springs are further addressed below with respect to FIG. 19. In some embodiments, motor control can be automatic (e.g., via processor 210 and/or 302) or manual (user controlled) as further discussed below at least with respect to FIG. 21.

Figure 18A:
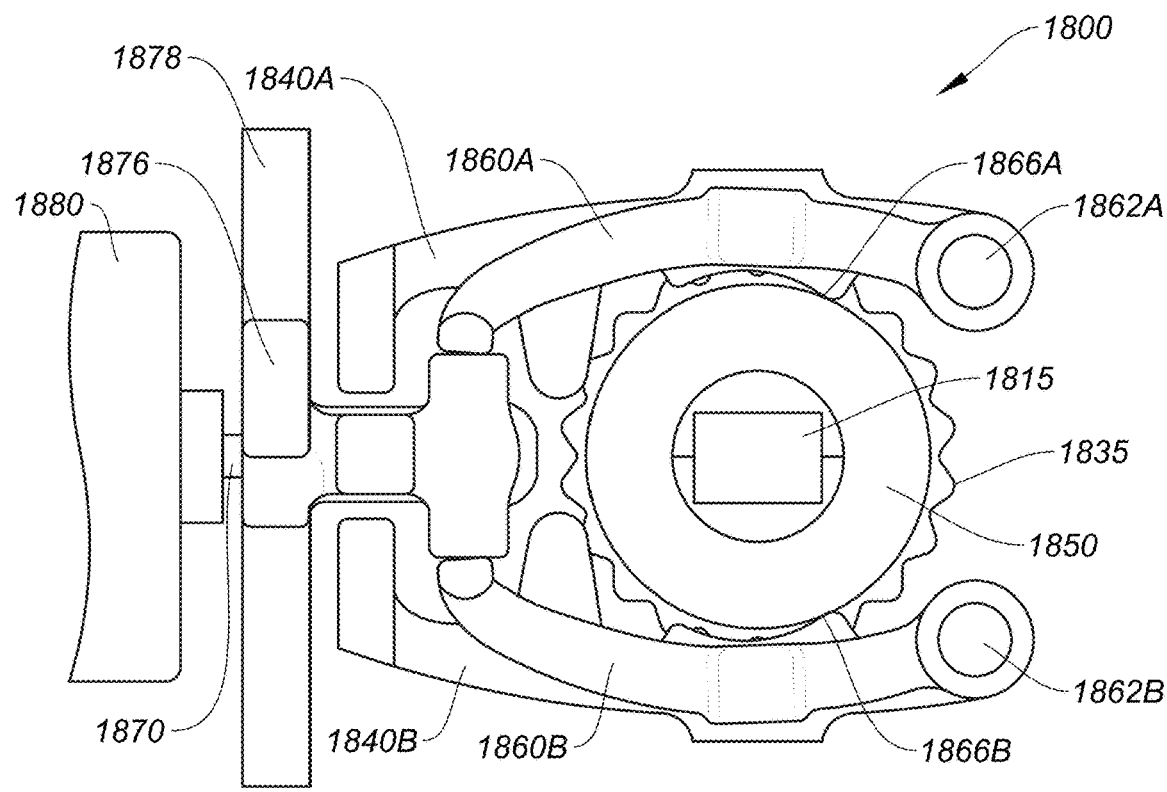
FIG. 18A shows a bottom view of a dual-arm smart-shift mechanical ratchet system for a knob configured in a ratchet-mode of operation, according to certain embodiments.
Figure 18B:
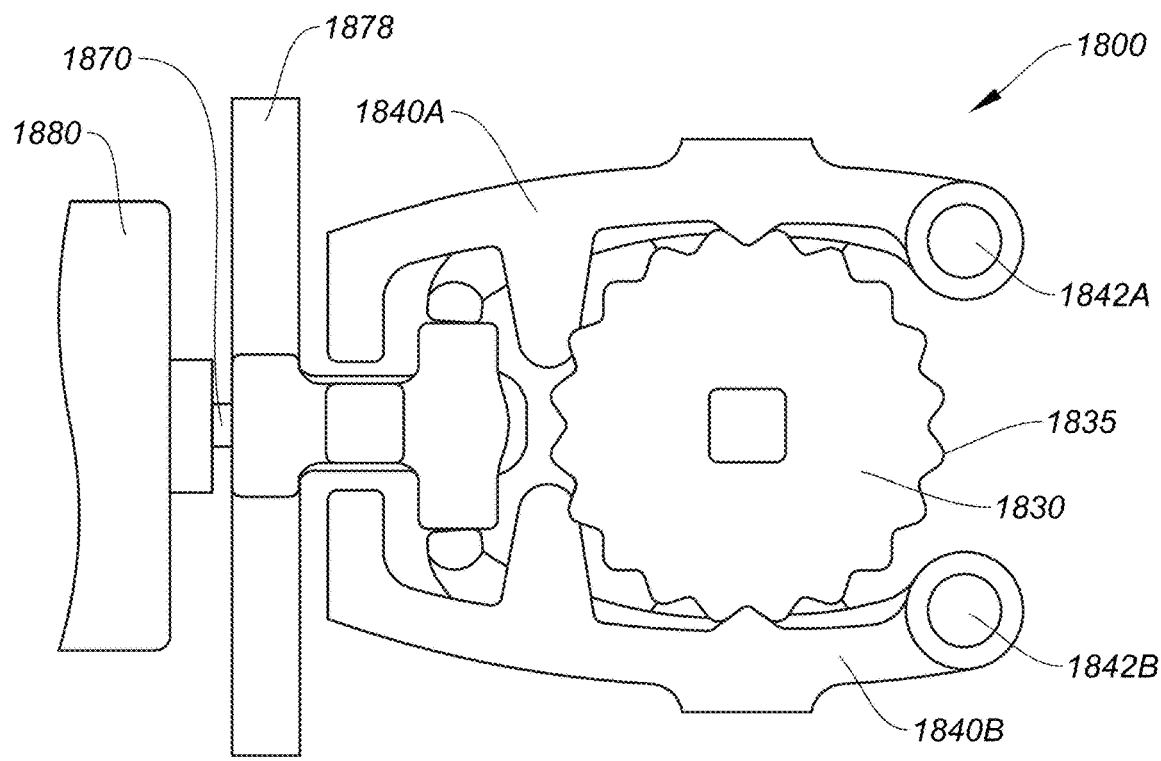
FIG. 18B shows a top view of a dual-arm smart-shift mechanical ratchet system for a knob configured in a ratchet-mode of operation, according to certain embodiments.

The various embodiments depicted herein show a particular arrangement of components (e.g., shaft, ratchet wheel, resistance wheel, switch, etc.) in axial alignment along an axis, and a motor and camshaft extending laterally and substantially normal to the axis. Any arrangement of components can be used as would be understood by one of ordinary skill in the art. Although a single ratchet arm and resistance arm is shown, some embodiments may employ dual-armed systems, as shown in FIGS. 18A-18B. In some cases, ratchet wheel 1530 and resistance wheel 1550 may be separate components separated by a distance (e.g., 1-10 mm; other distances are possible, as would be understood by one of ordinary skill in the art) along knob shaft 1520, in contact with each other, or combined in a common wheel with both a toothed perimeter and a smooth perimeter.

Ratchet Mode of Operation

The ratchet mode of operation, as discussed above, causes a knob (e.g., knob 450) to rotate in a ratcheted manner over a number of discrete positions, as further discussed above with respect to FIG. 10. In some embodiments, the ratcheted rotation can vary depending on how much force is applied by the ratchet arm to the ratchet wheel when the ratchet arm engages the ratchet wheel. For example, a strong ratcheted rotation may result from an increased force by a corresponding compression spring. A weak ratcheted rotation may result from a reduced force by the corresponding compression spring, an additional cam (discussed below), or any other suitable method of reducing the amount of force that pushes the wheel contact region onto the toothed perimeter of the ratchet wheel. In some embodiments, the ratchet arm (i.e., wheel contact region 1546) may be normally (i.e., by default) engaged with the ratchet wheel. Some alternative embodiments may utilize a normally disengaged configuration where the ratchet arm is normally (i.e., by default) disengaged from the ratchet wheel. One of ordinary skill in the art with the benefit of this disclosure would understand the many variations, modifications, and alternative embodiments thereof.

Figure 16A:
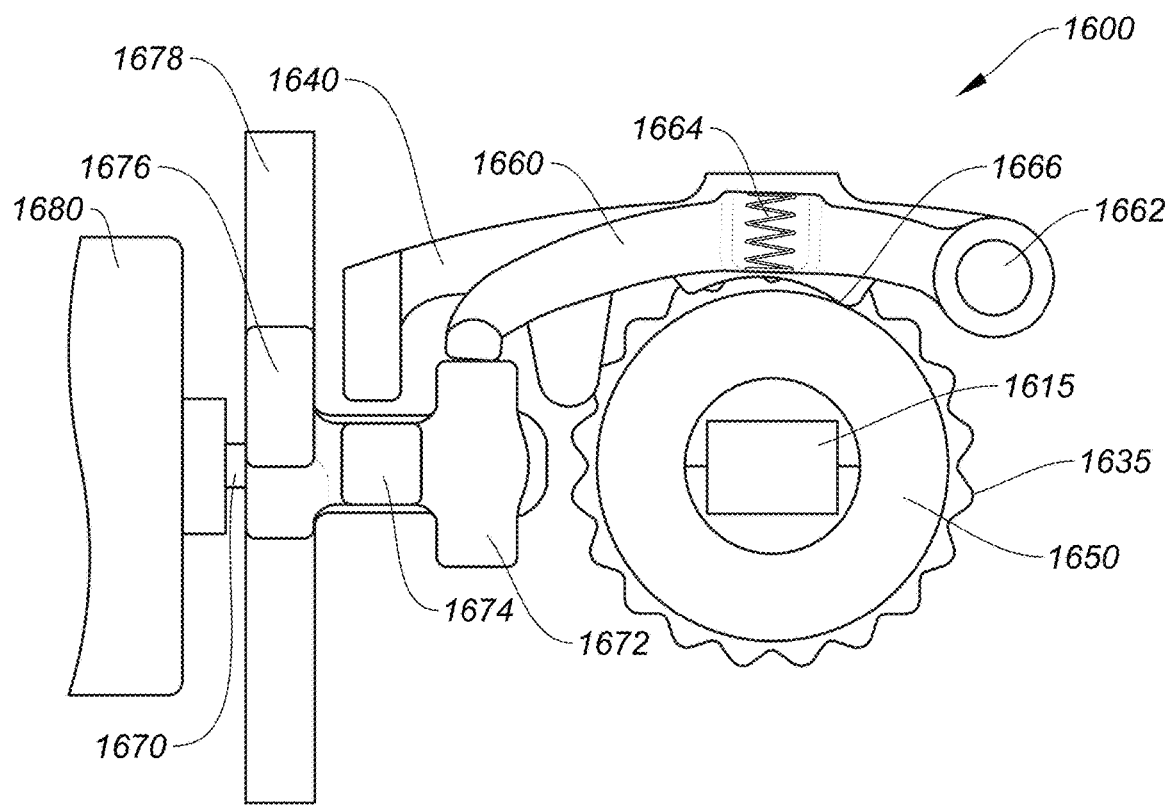
FIG. 16A shows a bottom view of a smart-shift mechanical ratchet system for a knob configured in a ratchet-mode of operation, according to certain embodiments.
Figure 16B:
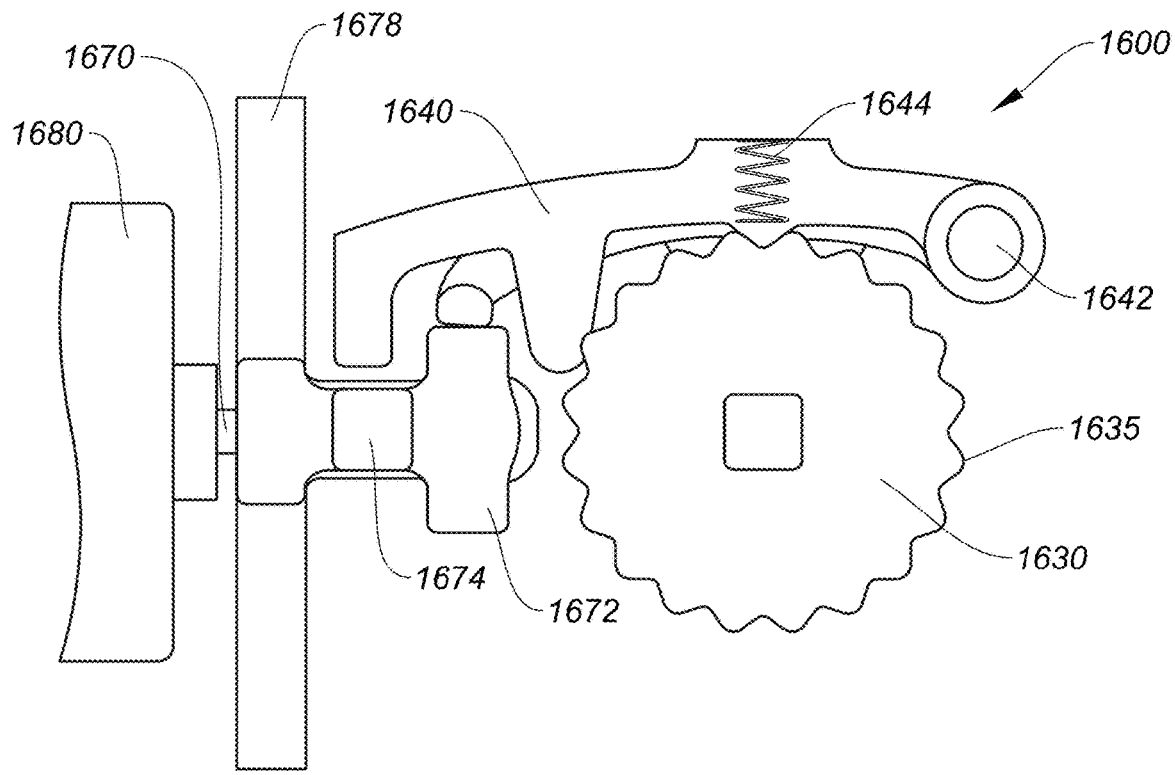
FIG. 16B shows a top view of a smart-shift mechanical ratchet system for a knob configured in a ratchet-mode of operation, according to certain embodiments.

FIG. 16A shows a bottom view of a smart-shift mechanical ratchet system ("SMRS") 1600 for a knob configured in a ratchet-mode of operation, according to certain embodiments. FIG. 16B is a top view thereof. SMRS 1600 can include knob housing and knob shaft (not shown), ratchet wheel 1630 with toothed perimeter 1635, and ratchet arm 1640 which can include pivot point 1642, compression spring(s) 1644, and wheel contact region 1646. SMRS 1600 can further include resistance wheel 1650 having smooth perimeter 1655, resistance arm 1660 that may include pivot point 1662, compression spring(s) 1664, and wheel contact region 1666, and cam shaft 1670 that may include first cam 1672, second cam 1674, and third cam 1676, brake system ("obstruction") 1678, motor 1680, and switch 1615.

Ratchet arm 1640, as shown, can be configured to be normally (e.g., by default) engaged with ratchet wheel 1630 by a force provided by compression spring 1644. Similarly, resistance arm 1660 can be configured to be normally engaged with resistance wheel 1650 by a force provided by compression spring 1664. Thus, both ratchet arm 1640 and resistance arm 1660 may be engaged with their corresponding wheel by default, such that both a ratcheting effect and a resistance effect is applied when no other forces are applied (e.g., when no cams are contacting the ratchet and/or resistance arms). Both modes of operation are not typically operated at the same time, however some embodiments may use both, e.g., for increased resistance in a ratcheted mode of operation. Such embodiments may require different cam arrangements on cam shaft 1670, as would be understood by one of ordinary skill in the art with the benefit of this disclosure.

In some embodiments, the cam system of cam shaft 1670 can control the mode of operation by causing the normally engaged ratchet or resistance arm to disengage with its corresponding wheel. Referring to FIGS. 16A and 16B, "resistance" cam 1672 is rotated to a position that causes resistance arm 1660 to lift and rotate from pivot point 1662 such that wheel contact region 1666 disengages with resistance wheel 1650. In contrast, "ratchet" cam 1674 simultaneously does not contact ratchet arm 1640, leaving ratchet arm 1640 normally engaged with ratchet wheel 1630, and thereby placing SMRS 1600 in a ratchet mode of operation. FIG. 16B depicts wheel contact region 1646 of ratchet arm 1640 contacting toothed perimeter 1635 of ratchet wheel 1630.

Cams 1672 and 1674 are shown to be disposed substantially 90 degrees out of phase with each other to ensure that both ratchet arm 1640 and resistance arm 1660 do not simultaneously disengage with their corresponding wheels. However, other cam systems are contemplated. For instance, some cam systems may be configured to support simultaneous engagement and/or disengagement of the ratchet and resistance arms. Simultaneous disengagement may be applied to cause knob 450 to rotate freely (no ratcheting or resistance). In some cases, simultaneous engagement may be applied for a high resistance ratcheting effect. Alternatively or additionally, adding or removing force from one or both arms 1640, 1660 can be performed by an adjustable compression spring, as further discussed below. One of ordinary skill in the art would understand the many variations, modifications, and alternative embodiments thereof.

In certain embodiments, in response to receiving a control signal to place SMRS 1600 in a ratchet-mode of operation, motor 1680 (e.g., controlled by processor 210) may rotate cam shaft 1670 such that third cam 1676 moves to a first position and is stopped by brake system 1678, which thereby aligns resistance cam 1672 with resistance arm 1660 to disengage resistance arm 1660 from resistance wheel 1650, as described above.

Figure 17A:
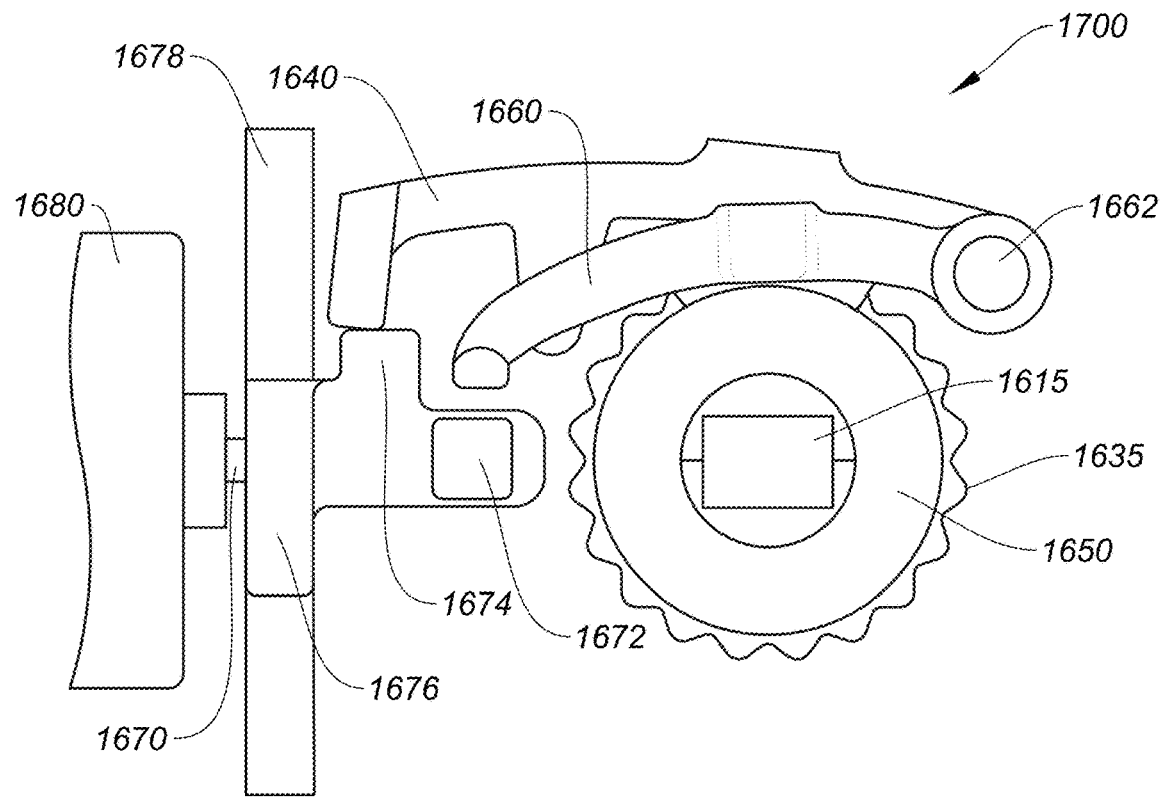
FIG. 17A shows a bottom view of a smart-shift mechanical ratchet system for a knob configured in a resistance-mode of operation, according to certain embodiments.
Figure 17B:
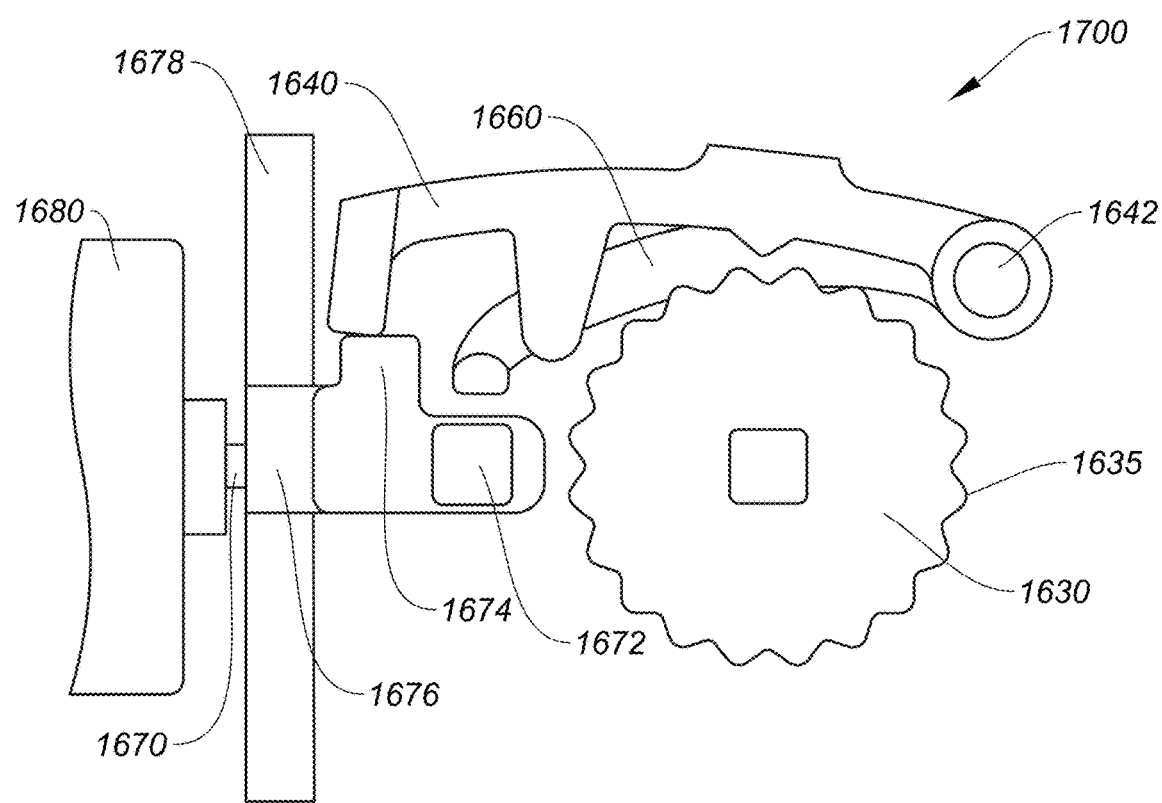
FIG. 17B shows a top view of a smart-shift mechanical ratchet system for a knob configured in a resistance-mode of operation, according to certain embodiments.

FIG. 17A shows a bottom view of a smart-shift mechanical ratchet system ("SMRS") 1600 for a knob configured in a resistance-mode of operation, according to certain embodiments. FIG. 17B is a top view thereof. FIGS. 17A-17B, as shown, include similar components as FIGS. 16A-16B, but are configured in a resistance-mode of operation.

As indicated above, the cam system of cam shaft 1670 can control the mode of operation by causing the normally engaged ratchet or resistance arm to disengage with its corresponding wheel. Referring to FIGS. 17A and 17B, "ratchet" cam 1674 can be rotated to a position that causes ratchet arm 1640 to lift and rotate from pivot point 1642 such that wheel contact region 1646 disengages with ratchet wheel 1630. In contrast, "resistance" cam 1672 simultaneously does not contact resistance arm 1660, leaving resistance arm 1660 normally engaged with resistance wheel 1650, and thereby placing SMRS 1600 in a resistance mode of operation. FIG. 17A depicts wheel contact region 1666 of resistance arm 1660 contacting substantially smooth perimeter 1655 of resistance wheel 1650.

In certain embodiments, in response to receiving a control signal to place SMRS 1600 in a resistance-mode of operation, motor 1680 (e.g., controlled by processor 210) may rotate cam shaft 1670 such that third cam 1676 moves to a second position and is stopped by brake system 1678, which thereby aligns ratchet cam 1674 with ratchet arm 1640 to disengage resistance arm 1660 from resistance wheel 1650, as described above.

FIG. 18A shows a bottom view of a dual-arm smart-shift mechanical ratchet system 1800 ("SMRS") for a knob configured in a ratchet-mode of operation, according to certain embodiments. FIG. 18B is a top view thereof. FIGS. 18A-18B may operate similarly to FIGS. 16A-17B, with the addition of a second set of arms and corresponding hardware. Some embodiments of SMRS 1800 can include a knob housing (not shown), knob shaft 1820, ratchet wheel 1830 with toothed perimeter 1835, ratchet arms 1840a and 1840b which can include pivot points 1842a and 1842b, compression spring(s) 1844a and 1844b, and wheel contact regions 1846a and 1846b. SMRS 1800 can further include resistance wheel 1850 having smooth perimeter 1855, resistance arms 1860a and 1860b that may include pivot points 1862a and 1862b, compression spring(s) 1864a and 1864b, and wheel contact regions 1866a and 1866b, and cam shaft 1870 that may include "ratchet" first cams 1872a and 1872b, "resistance" second cams 1874a and 1874b, and third cam 1876, brake system ("obstruction") 1878, motor 1880, and switch 1815.

In some embodiments, SMRS 1800 may provide improved performance characteristics such as better stability (e.g., an even application of force on opposite sides of a corresponding wheel), a greater possible application of force (e.g., for increased range in intensity for ratchet and/or resistance modes of operation), or the like. One of ordinary skill in the art would understand the many variations, modifications, and alternative embodiments thereof.

Figure 19:
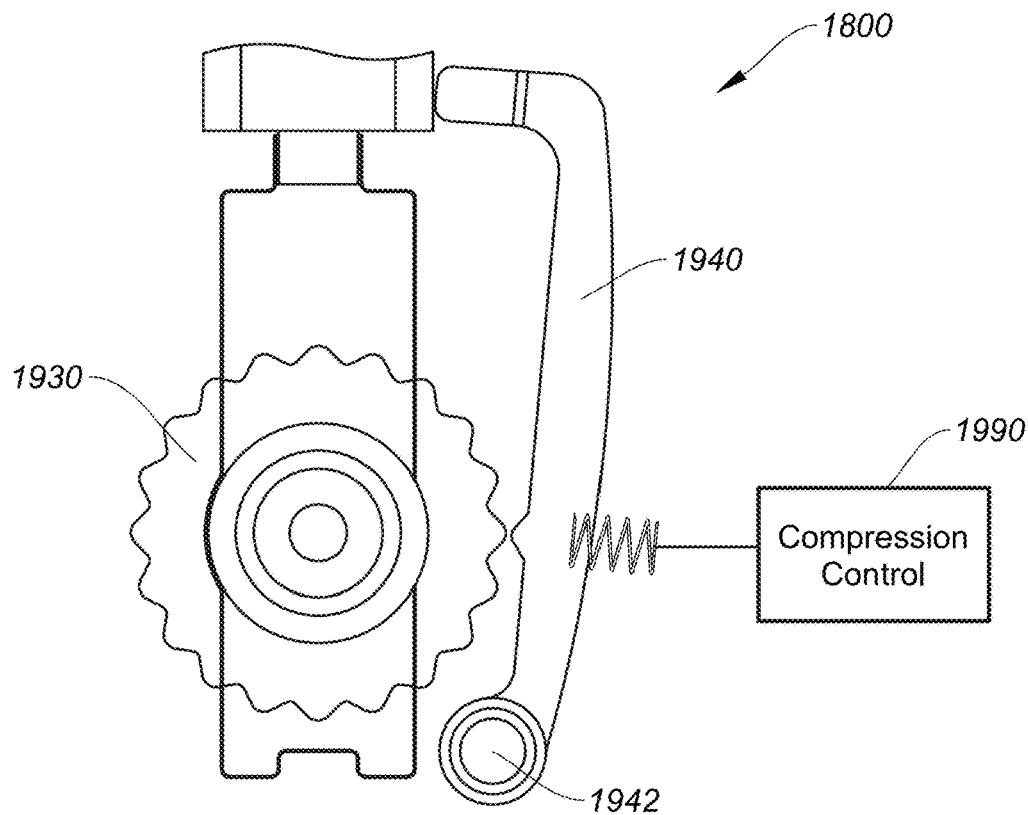
FIG. 19 shows a simplified embodiment of a smart-shift mechanical ratchet system with an adjustable compression spring, according to certain embodiments.

FIG. 19 shows a simplified embodiment of a smart-shift mechanical ratchet system 1900 with an adjustable compression spring 1944, according to certain embodiments. Only portions of SMRS 1900 are shown to place emphasis on aspects of adjustable compression spring 1944, which may be automatically controlled (e.g., via processor 210 and/or 302, by a compression control block 1990, which may be controlled, e.g., by processor 210 and/or 302, or the like), manually controlled (e.g., via a switch, knob, or other manually controlled mechanism), or a combination thereof. An adjustable compression spring can be used to control the intensity of the ratcheted rotation or frictional rotation. Referring to the example of FIG. 19, an increased force on ratchet arm 1940 toward ratchet wheel 1930 can increase the intensity of the ratcheted rotation of the knob (not shown), while a reduced force on ratchet arm 1940 toward ratchet wheel 1930 can decrease the intensity of the ratcheted rotation. Likewise, an increased force on resistance arm 1960 toward resistance wheel 1950 can increase the intensity of the frictional rotation of the knob (not shown) making it harder to rotate, while a reduced force toward resistance wheel 1950 can decrease the intensity of the frictional rotation, making it easier to rotate. Some embodiments may include multiple settings including fixed points or a full range (analog control) of settings. In some cases, multiple springs may be used.

Alternatively or additionally, additional cams (not shown) can be used to control an intensity of ratcheting or resistance. For example, instead of changing the force applied by a compression spring, an additional cam may cause an engaged ratchet arm to lift slightly to reduce but maintain contact with the ratchet wheel, causing a reduced-intensity ratcheted rotation. Similarly, an additional cam may cause an engaged resistance arm to lift slightly to reduce but maintain contact with the resistance wheel, causing a reduced-intensity frictional rotation. One of ordinary skill in the art would understand the many variations, modifications, and alternative embodiments thereof.

Figure 20:
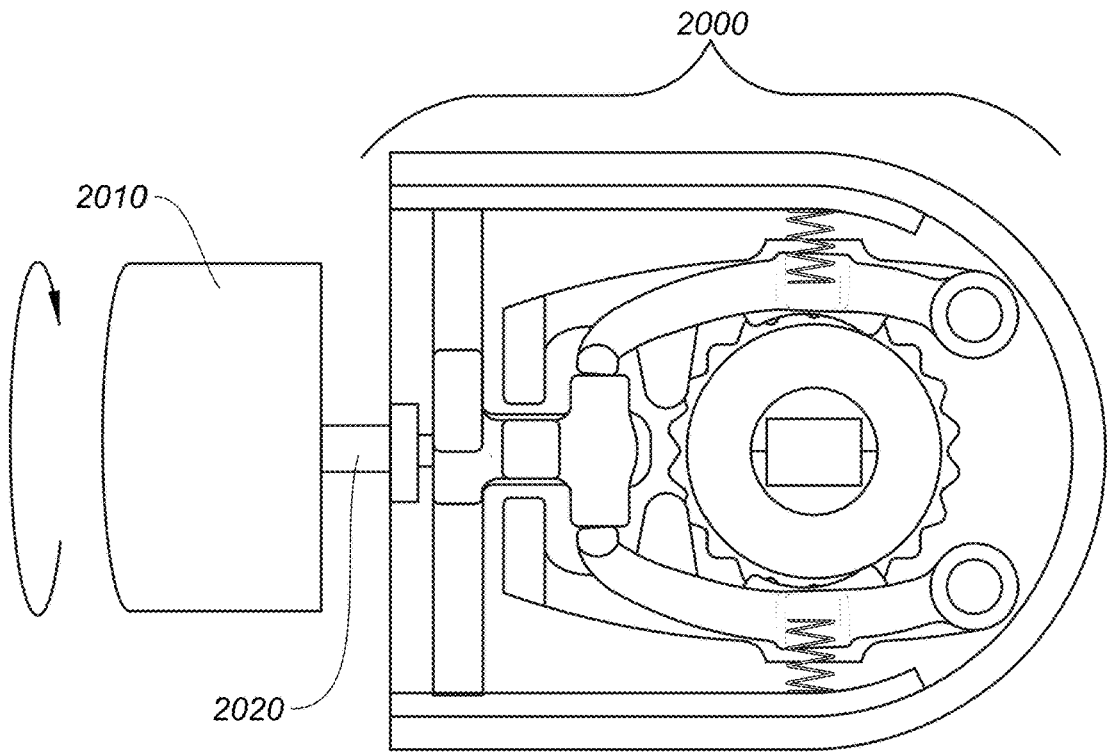
FIG. 20 shows a smart-shift mechanical ratchet system with manual operation, according to certain embodiments.

FIG. 20 shows a smart-shift mechanical ratchet system 2000 with manual operation, according to certain embodiments. In some implementations, a user may manually control the operation of SMRS 2000 by rotating knob 2010 and corresponding cam shaft 2020 between a first position (e.g., for a ratcheted rotation) and a second position (e.g., for a frictional rotation), as mentioned above. Although a knob is depicted, any suitable mechanism may be used to rotate cam shaft 2070 between first and second positions (or additional positions) including, but not limited to, a button, switch, lever, touch-activated actuator, etc. One of ordinary skill in the art would understand the many variations, modifications, and alternative embodiments thereof.

Figure 21:
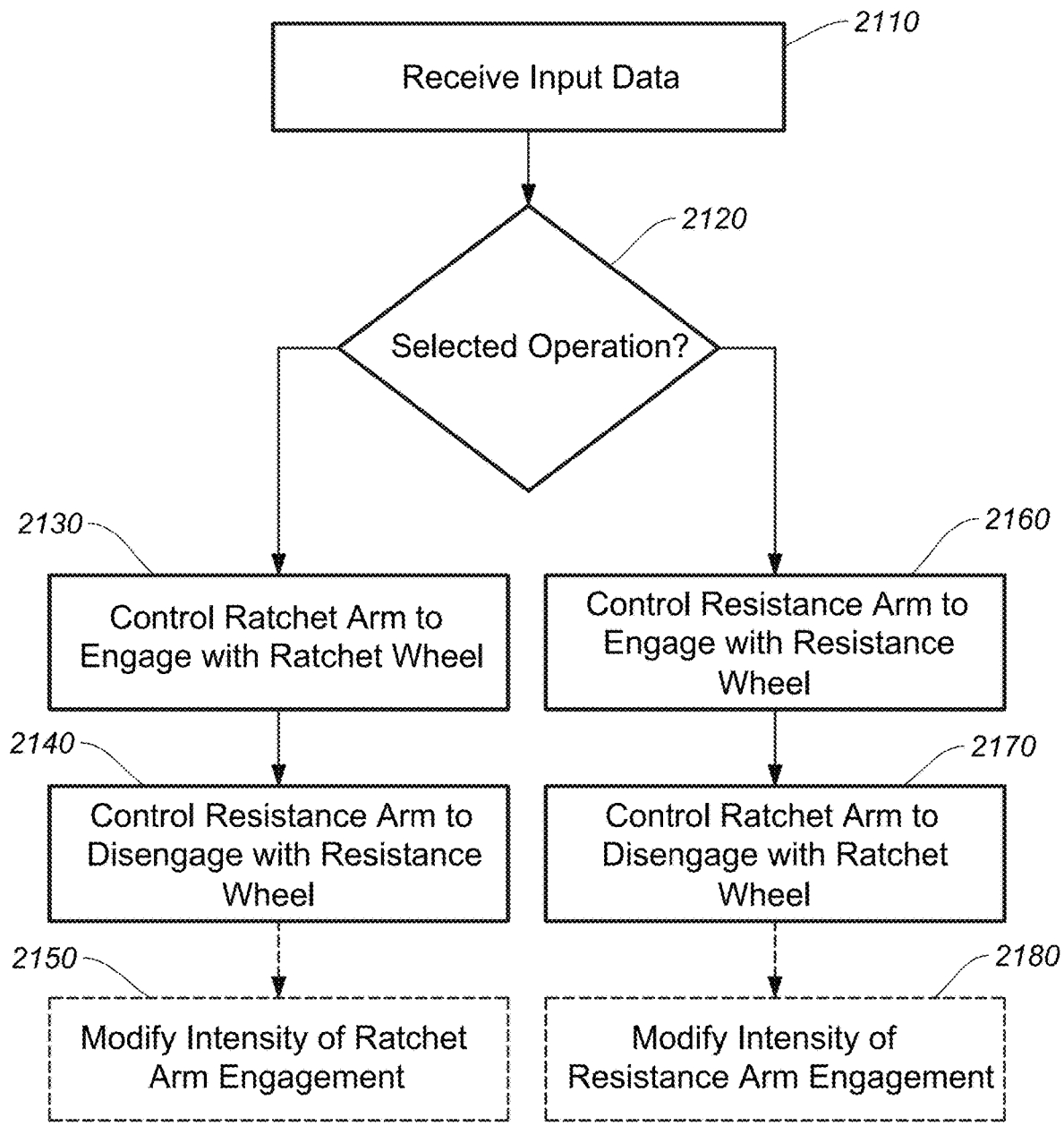
FIG. 21 shows a simplified flow diagram for controlling a smart-shift mechanical ratchet system, according to certain embodiments.

FIG. 21 shows a simplified flow diagram 2100 for controlling a smart-shift mechanical ratchet system (e.g., SMRS 1600), according to certain embodiments. Method 2100 can be performed by processing logic that may comprise hardware (circuitry, dedicated logic, etc.), software operating on appropriate hardware (such as a general purpose computing system or a dedicated machine), firmware (embedded software), or any combination thereof. In certain embodiments, method 2100 can be performed by processor 210 of system 200, processor 302 of system 300, or a combination thereof, as shown and described above with respect to FIGS. 2-3. SMRS 1600 is referenced for the purpose of explaining aspects of the invention. However, method 2100 is not limited to any particular embodiment explicitly or tacitly described herein.

At step 2110, method 2100 can include receiving input data, according to certain embodiments. The input data may correspond to a selection of one of a ratchet mode of operation for the knob (450), or a resistance-mode of operation for the knob (step 2120), as further discussed above at least with respect to FIGS. 8-10. In one non-limiting example, processor 210 may receive control data from a host computer including data corresponding to a contextual usage of a cursor on a screen. The control data may indicate a corresponding mode of operation, or processor 210 may select a mode of operation based on the control data. One of ordinary skill in the art would understand the many variations, modifications, and alternative embodiments thereof.

At step 2130 of method 2100, when the selection corresponds to the ratchet-mode of operation, motor 1680 controls (rotates) cam shaft 1670 and corresponding ratchet cam 1674 to rotate to a first position causing ratchet arm 1640 to engage with ratchet wheel 1630, thereby configuring knob 450 in the ratchet-mode operation. In some embodiments, ratchet arm 1640 may be normally engaged (i.e., by default) such that when ratchet arm 1640 is not manipulated by corresponding cam 1674, wheel contact region 1646 contacts ratchet wheel 1630. Specifically, ratchet arm 1640 may engage with toothed perimeter 1635 of a ratchet wheel 1630 that is axially coupled to knob 450 to provide a ratcheted rotation when knob 450 is rotated. In alternative embodiments, ratchet arm 1640 may be normally disengaged.

At step 2140 of method 2100, when the selection corresponds to the ratchet-mode of operation, the first position (of cam shaft 1670) may further cause resistance arm 1660 to disengage with resistance wheel 1650, according to certain embodiments.

In some embodiments, the ratchet arm may include a first set of compression springs to cause the ratchet arm to be normally engaged with the ratchet wheel, and the resistance arm may include a second set of compression springs to cause the resistance arm to be normally engaged with the resistance wheel. In some cases, the input data further can further include intensity data. Thus, at step optional 2150, method 2100 can include modifying an intensity of the ratcheted rotation based on the intensity data. In some cases, modifying the intensity of the ratcheted rotation may include controlling the rotation of cam shaft 1670 such that an additional cam on cam shaft 1670 provides a disengaging force to the ratchet arm by an amount corresponding to the intensity data. Alternatively or additionally, the intensity of the ratcheted rotation can be modified by controlling the force provided by the compression springs, as discussed above with respect to FIG. 20.

At step 2160 of method 2100, when the selection corresponds to the resistance-mode of operation, motor 1680 controls (rotates) cam shaft 1670 and corresponding cam 1672 to rotate to a second position causing resistance arm 1660 to engage with resistance wheel 1650, thereby configuring knob 450 in the resistance-mode operation. In some embodiments, resistance arm 1660 may be normally engaged (i.e., by default) such that when resistance arm 1660 is not manipulated by corresponding cam 1672, wheel contact region 1666 contacts resistance wheel 1650. Specifically, resistance arm 1660 may engage with toothed perimeter 1665 of a resistance wheel 1650 that is axially coupled to knob 450 to provide a frictional rotation when knob 450 is rotated. In alternative embodiments, resistance arm 1660 may be normally disengaged.

At step 2170 of method 2100, when the selection corresponds to the resistance-mode of operation, the second position (of cam shaft 1670) may further cause ratchet arm 1640 to disengage with ratchet wheel 1630, according to certain embodiments.

In some embodiments, the resistance arm may include a first set of compression springs to cause the resistance arm to be normally engaged with the resistance wheel, and the ratchet arm may include a second set of compression springs to cause the ratchet arm to be normally engaged with the resistance wheel. In some cases, the input data further can further include intensity data. Thus, at step optional 2180, method 2100 can include modifying an intensity of the frictional rotation based on the intensity data. In some cases, modifying the intensity of the frictional rotation may include controlling the rotation of cam shaft 1670 such that an additional cam on cam shaft 1670 provides a disengaging force to the frictional arm by an amount corresponding to the intensity data. Alternatively or additionally, the intensity of the frictional rotation can be modified by controlling the force provided by the compression springs, as discussed above with respect to FIG. 20. One of ordinary skill in the art would understand the many variations, modifications, and alternative embodiments thereof.

It should be appreciated that the specific steps illustrated in FIG. 21 provide a particular method 2100 for controlling a smart-shift mechanical ratchet system, according to certain embodiments. Other sequences of steps may also be performed according to alternative embodiments. For example, alternative embodiments may perform the steps outlined above in a different order. Moreover, the individual steps illustrated in FIG. 21 may include multiple sub-steps that may be performed in various sequences as appropriate to the individual step. Furthermore, additional steps may be added or removed depending on the particular applications. One of ordinary skill in the art would recognize and appreciate many variations, modifications, and alternatives of method 2100.

Other variations are within the spirit of the present disclosure. Thus, while the disclosed techniques are susceptible to various modifications and alternative constructions, certain illustrated embodiments thereof are shown in the drawings and have been described above in detail. It should be understood, however, that there is no intention to limit the disclosure to the specific form or forms disclosed, but on the contrary, the intention is to cover all modifications, alternative constructions and equivalents falling within the spirit and scope of the disclosure, as defined in the appended claims. For instance, any of the embodiments, alternative embodiments, etc., and the concepts thereof may be applied to any other embodiments described and/or within the spirit and scope of the disclosure.

The use of the terms "a" and "an" and "the" and similar referents in the context of describing the disclosed embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening. The phrase "based on" should be understood to be open-ended, and not limiting in any way, and is intended to be interpreted or otherwise read as "based at least in part on," where appropriate. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate embodiments of the disclosure and does not pose a limitation on the scope of the disclosure unless otherwise claimed. No language in the specification should be construed as indicating any non-claimed element as essential to the practice of the disclosure.

What is claimed is:

1. A computer-implemented method for an operation of a knob on an input device, the method comprising:
   receiving input data, by a processor, corresponding to a selection of one of a:
      ratchet-mode of operation for the knob; and
      a resistance-mode of operation for the knob;
   when the input data corresponds to the ratchet-mode of operation:
      controlling a ratchet arm to engage with a toothed perimeter of a ratchet wheel that is axially coupled to the knob that provides a ratcheted rotation when the knob is rotated;
   when the input data corresponds to the resistance-mode of operation:
      controlling a resistance arm to engage with a substantially smooth perimeter of a resistance wheel that is axially coupled to the knob that provides a frictional resistance to rotation when the knob is rotated.

2. The computer-implemented method of claim 1 wherein the ratchet arm includes a first set of compression springs to cause the ratchet arm to be normally engaged with the ratchet wheel, and
   wherein the resistance arm includes a second set of compression springs to cause the resistance arm to be normally engaged with the resistance wheel.

3. The computer-implemented method of claim 2 further comprising:
   when the input data corresponds to the ratchet-mode of operation:
      controlling the resistance arm to disengage from the resistance wheel; and
   when the input data corresponds to the resistance-mode of operation:
      controlling the ratchet arm to disengage from the ratchet wheel.

4. The computer-implemented method of claim 1 wherein the input data further includes intensity data,
   wherein when the input data corresponds to the ratchet-mode of operation: modifying an intensity of the ratcheted rotation based on the intensity data; and
   wherein when the input corresponds to the resistance-mode of operation: modifying an intensity of the frictional resistance to rotation based on the intensity data.

5. The computer-implemented method of claim 4 wherein modifying the intensity of the ratcheted rotation includes controlling the rotation of a cam shaft such that a first cam on the cam shaft provides a disengaging force to the ratchet arm by an amount corresponding to the intensity data, and
   wherein modifying the intensity of the frictional resistance to rotation includes controlling the rotation of the cam shaft such that a second cam on the cam shaft provides a disengaging force to the resistance arm by an amount corresponding to the intensity data.

6. The computer-implemented method of claim 1 further comprising:
   when the input data corresponds to the ratchet-mode of operation:
      controlling a second ratchet arm to engage with a toothed perimeter of a ratchet wheel that is axially coupled to the knob to provide a ratcheted rotation when the knob is rotated;
   when the input data corresponds to the resistance-mode of operation:
      controlling a second resistance arm to engage with a substantially smooth perimeter of a resistance wheel that is axially coupled to the knob to provide a frictional resistance to rotation when the knob is rotated.

7. The computer-implemented method of claim 1 wherein the knob is rotatable on an axis, a shaft extends from the knob along the axis, and wherein a switch is disposed below and substantially in axial alignment with the shaft, and wherein the knob is depressible, the method further comprising: activating the switch when the knob is depressed.

8. The computer-implemented method of claim 7 wherein a second shaft includes:
   a first cam protruding therefrom; and
   a second cam protruding therefrom,
   the method further comprising:
   in response to rotating the second shaft to a first position, causing the first cam to contact a portion of the ratchet arm that causes the ratchet arm to disengage the ratchet wheel; and
   in response to rotating the second shaft to a second position, causing the second cam to contact a portion of the resistance arm that causes the resistance arm to disengage the resistance wheel.

9. The computer-implemented method of claim 8 wherein the first cam and the second cam are configured on the second shaft such that:
   when the first cam contacts the ratchet arm, the second cam does not contact the resistance arm; and
   when the second cam contacts the resistance arm, the second cam does not contact the ratchet arm.

10. The computer-implemented method of claim 8 wherein the input device includes a processor and an electric motor controlled by the processor, the electric motor coupled to the second shaft, wherein the second shaft is rotatable by the electric motor to at least the first position and the second position.

11. The computer-implemented method of claim 1 wherein the toothed perimeter of the ratchet wheel includes a low friction material, and wherein the substantially smooth perimeter of the resistance wheel includes a high friction material.

\* \* \* \* \*